US008027641B2

(12) United States Patent
Ibrahim et al.

(10) Patent No.: US 8,027,641 B2
(45) Date of Patent: *Sep. 27, 2011

(54) METHOD AND SYSTEM FOR DETECTING CHANNELS SUITABLE FOR FM TRANSMISSION IN AN INTEGRATED FM TRANSMIT/RECEIVE SYSTEM

(75) Inventors: Brima Ibrahim, Aliso Viejo, CA (US);
John Walley, Ladera Ranch, CA (US);
Scott Bibaud, Santa Ana, CA (US);
Bojko Marholev, Irvine, CA (US);
Prasan Pai, Mission Viejo, CA (US);
Siukai Mak, Poway, CA (US)

(73) Assignee: Broadcom Corporation, Irvine, CA (US)

( * ) Notice: Subject to any disclaimer, the term of this patent is extended or adjusted under 35 U.S.C. 154(b) by 371 days.

This patent is subject to a terminal disclaimer.

(21) Appl. No.: 11/832,844

(22) Filed: Aug. 2, 2007

(65) Prior Publication Data
US 2008/0233883 A1    Sep. 25, 2008

Related U.S. Application Data

(60) Provisional application No. 60/895,665, filed on Mar. 19, 2007.

(51) Int. Cl.
*H04B 1/00*    (2006.01)
(52) U.S. Cl. .................. 455/42; 455/179.1; 455/556.1; 455/557

(58) Field of Classification Search .................. 455/42
See application file for complete search history.

(56) References Cited

U.S. PATENT DOCUMENTS

| | | | |
|---|---|---|---|
| 5,125,105 A | 6/1992 | Kennedy et al. | |
| 5,179,593 A * | 1/1993 | Sakata | 381/3 |
| 5,280,636 A | 1/1994 | Kelley et al. | |
| 6,658,267 B1 * | 12/2003 | Baranowski et al. | 455/556.1 |
| 7,447,488 B2 * | 11/2008 | Howard et al. | 455/179.1 |
| 2007/0010221 A1 | 1/2007 | Howard et al. | |
| 2008/0214238 A1 * | 9/2008 | Rokusek et al. | 455/557 |

* cited by examiner

*Primary Examiner* — Duc Nguyen
*Assistant Examiner* — Ajibola Akinyemi
(74) *Attorney, Agent, or Firm* — McAndrews, Held & Malloy, Ltd.

(57) ABSTRACT

A method and system is provided processing channel information may include in a mobile FM radio system including an integrated FM radio transmitter and FM radio receiver, dynamically generating a list of local FM channels, ranking local FM channels in the generated list, and selecting one of the ranked local FM channels for use by the FM transmitter based on neighboring channel interference. The FM radio receiver may detect FM channels being transmitted or not being transmitted, detect a pilot signal or a channel transmission pause. A tuning frequency of the FM radio receiver may be adjusted for scanning and detecting the local FM channels based on knowledge of a location of the FM radio receiver, received signal strength indicator (RSSI), dynamically scanning for local FM channel based on received RDS/RDBS data or country code, and/or carrier error of a related FM signal.

36 Claims, 14 Drawing Sheets

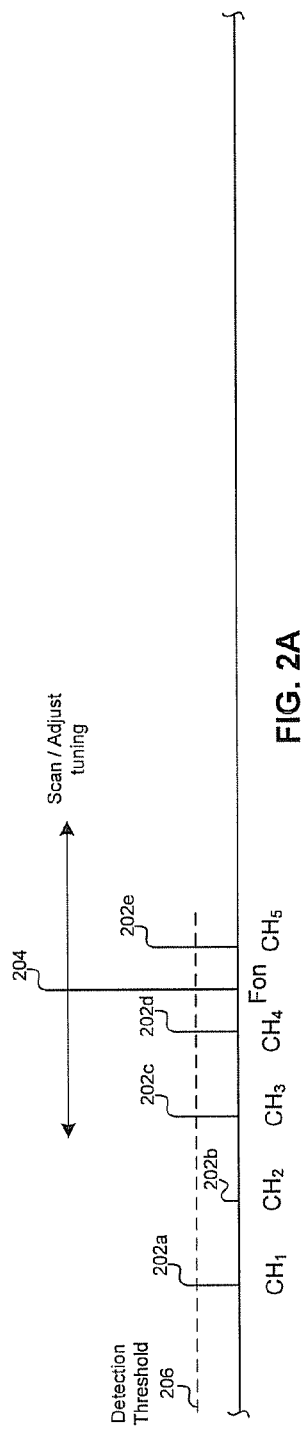
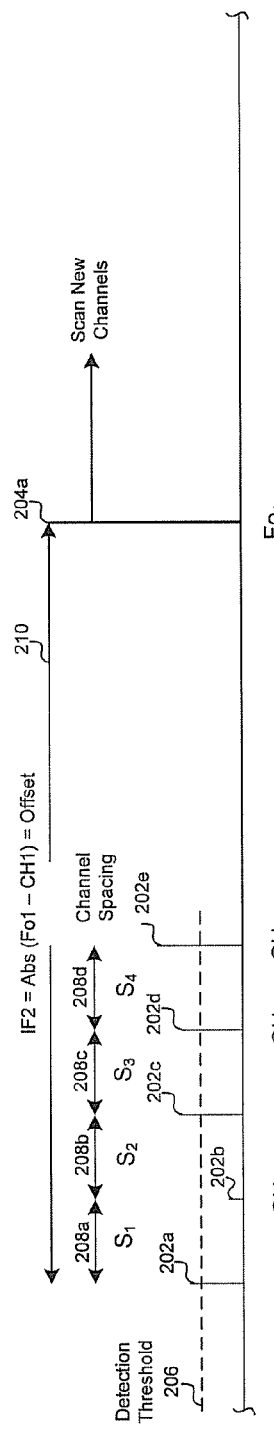
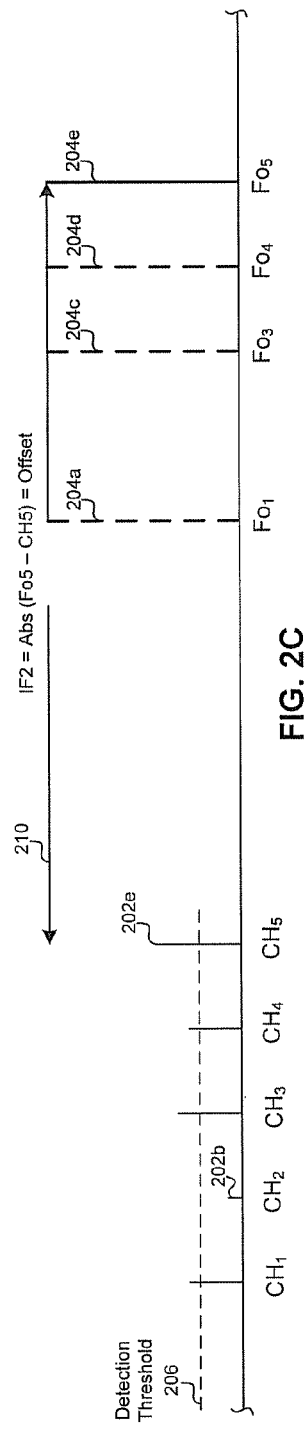
FIG. 2A
FIG. 2B
FIG. 2C

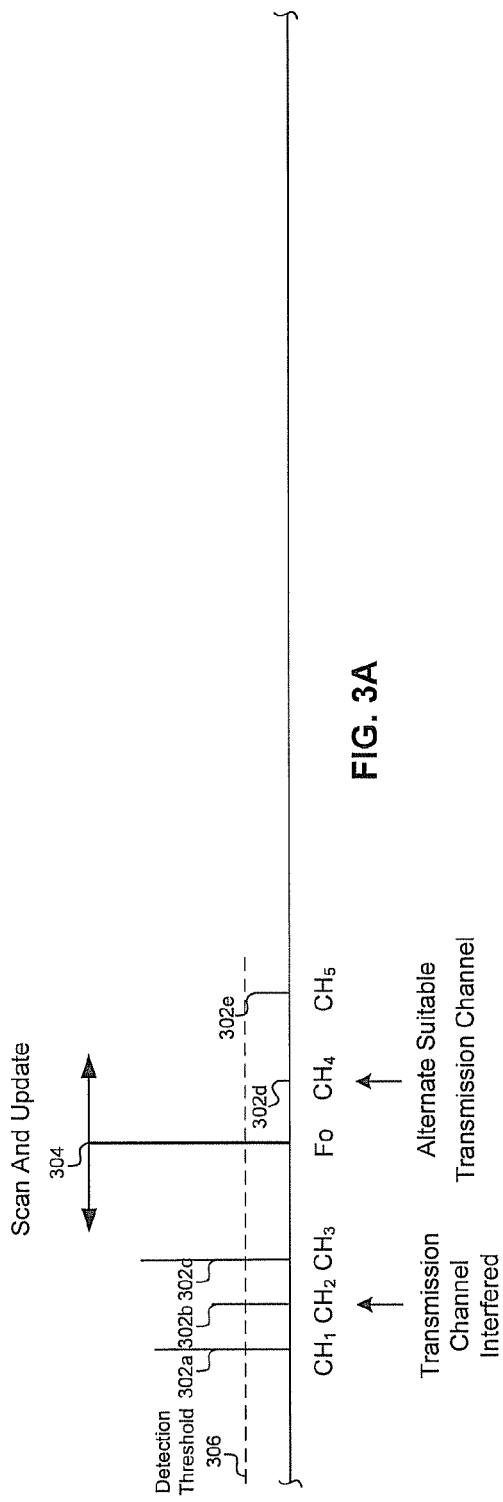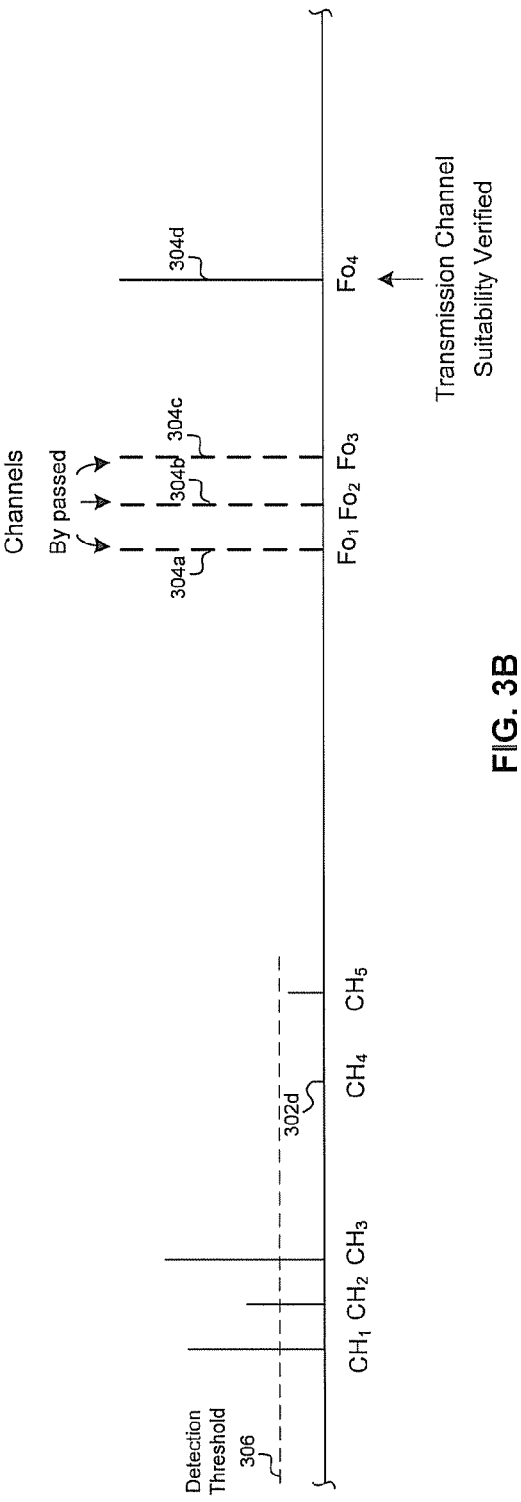

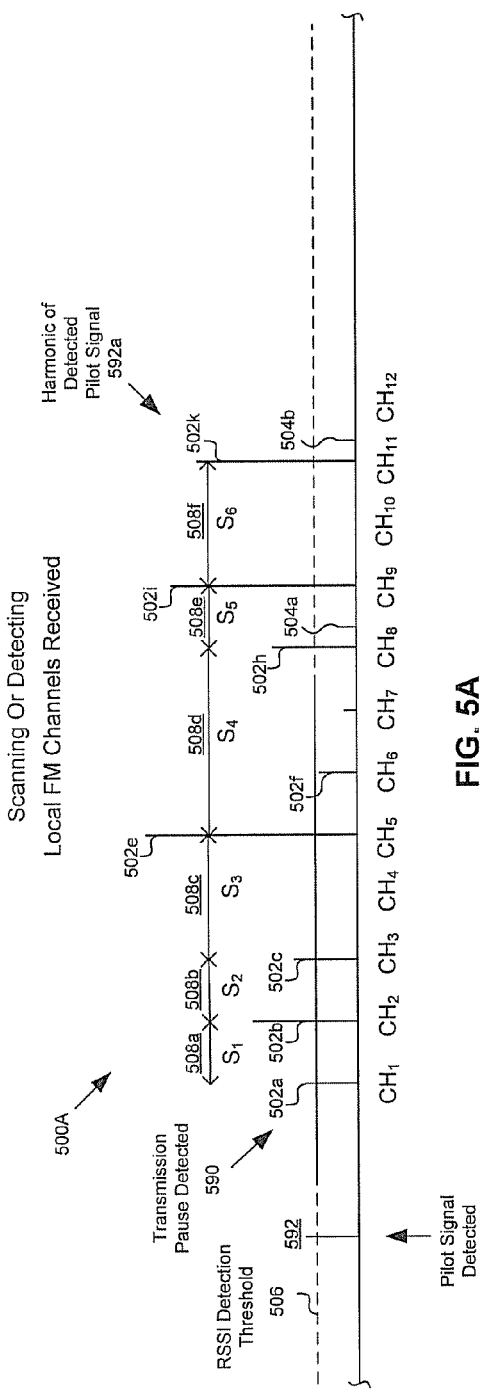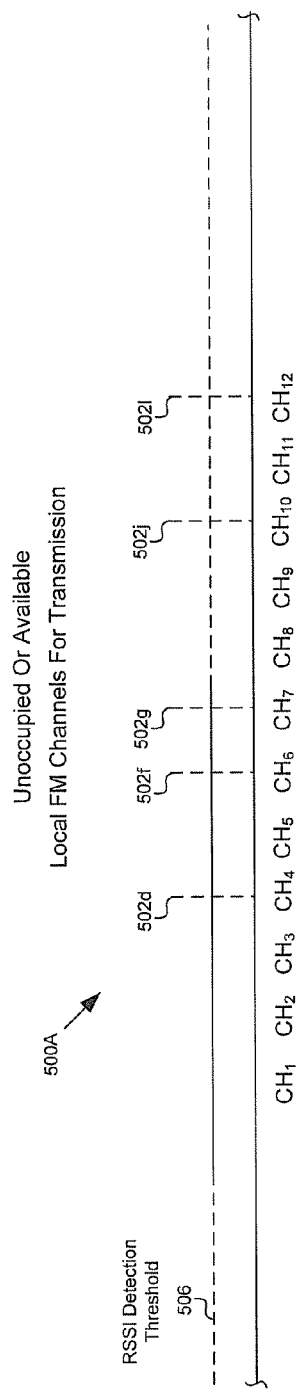

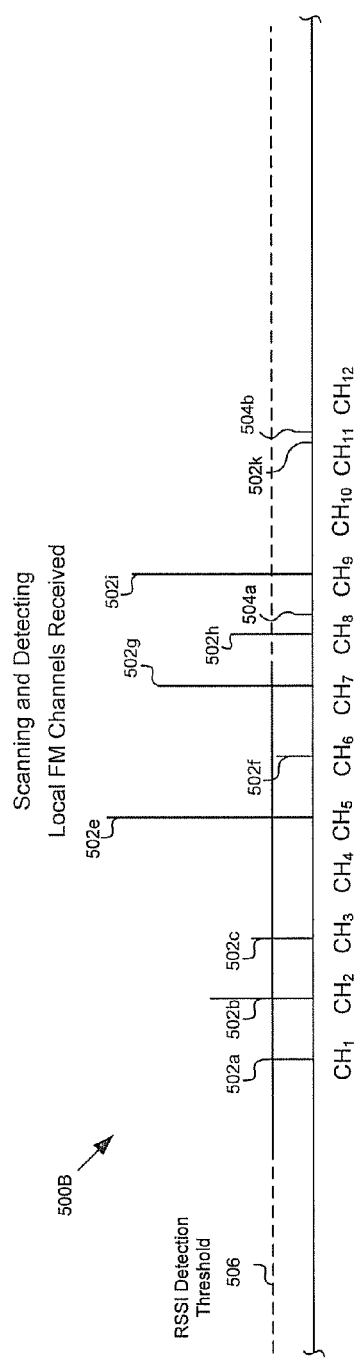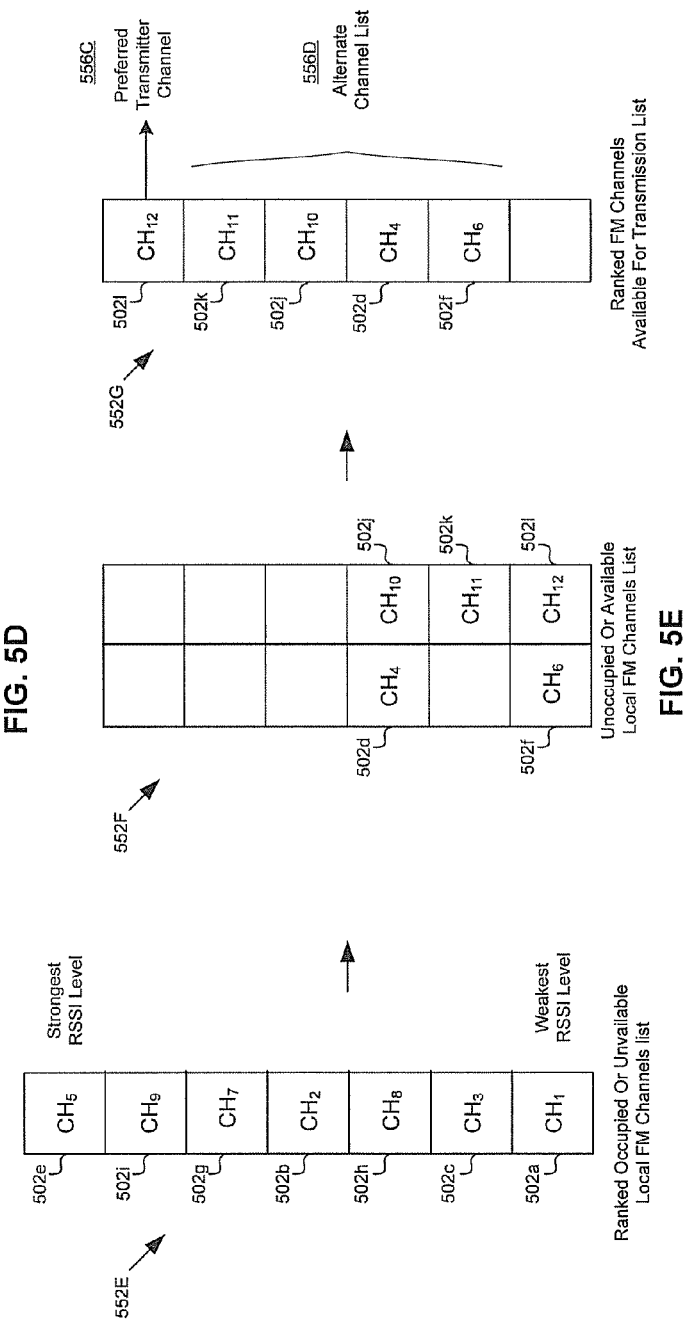

METHOD AND SYSTEM FOR DETECTING CHANNELS SUITABLE FOR FM TRANSMISSION IN AN INTEGRATED FM TRANSMIT/RECEIVE SYSTEM

CROSS-REFERENCE TO RELATED APPLICATIONS/INCORPORATION BY REFERENCE

This application is a continuation-in-part of application Ser. No. 11/755,395 filed on May 30, 2007, which has been issued into U.S. Pat. No. 7,869,779. This application also makes reference to, claims priority to, and claims the benefit of U.S. Provisional Application Ser. No. 60/895,665 filed on Mar. 19, 2007.

This application also makes reference to: U.S. application Ser. No. 11/832,858 filed on even date herewith.

Each of the above stated application is hereby incorporated herein by reference in its entirety.

FIELD OF THE INVENTION

Certain embodiments of the invention relate to wireless communication. More specifically, certain embodiments of the invention relate to a method and system for detecting channels suitable for FM transmission in an integrated FM transmit receive (FM Tx/Rx) system.

BACKGROUND OF THE INVENTION

Frequency Modulation (FM) is a form of modulation in wireless communication which represents information as variations in the instantaneous center frequency of a carrier wave. Frequency modulation was chosen as a modulation standard for high frequency signal transmission. A plurality of FM frequencies (channels) each separated by a frequency spacing may be broadcasted by a transmitter tower, a radio station or by a transmitting FM radio device.

A FM radio receiver of a FM radio includes a tuner with a tunable local oscillator (LO) may scan or search for broadcasted local FM frequency channels. Scanning may be performed by tuning the LO across the full tuning range of the LO or sweep the LO back and forth over a narrower tuning range to search for a signal of interest such as a FM channel. A FM channel may be detected or tuned if the FM radio receiver may successfully process a signal of sufficient signal amplitude, and/or the tuner may be able to establish an intermediate frequency (IF) signal that may be substantially the same or close to a defined offset of the FM radio receiver. When signals of two similar frequencies (from different broadcast stations or a neighboring broadcasting device) are received by the FM radio receiver, the FM radio receiver may process the stronger of two signals being broadcasted on the same frequency.

Radio Data System (RDS) or Radio Broadcast Data System (RBDS) standard format may be transmitted as a sub-carrier on the FM signals. The RDS/RDBS data format may contain information such as alternate frequencies of the broadcast station, the clock time, program identification with known channel frequency, channel spacing, station ID, country code or country identity, regional links and Enhanced Other Networks (EON) etc.

Further limitations and disadvantages of conventional and traditional approaches will become apparent to one of skill in the art, through comparison of such systems with some aspects of the present invention as set forth in the remainder of the present application with reference to the drawings.

BRIEF SUMMARY OF THE INVENTION

A method and system for detecting channels suitable for FM transmission in an integrated FM transmit receive (FM Tx/Rx) system, substantially as shown in and/or described in connection with at least one of the figures, as set forth more completely in the claims. These and other advantages, aspects and novel features of the present invention, as well as details of an illustrated embodiment thereof, will be more fully understood from the following description and drawings.

BRIEF DESCRIPTION OF SEVERAL VIEWS OF THE DRAWINGS

FIG. 2A is a diagram illustrating an initial scanning process for channel tuning of an integrated FM transmitter and FM radio receiver in a local FM frequency spectrum, in accordance with an embodiment of the invention.

FIG. 2B is a diagram illustrating a local FM channel scanning process of the integrated FM transmitter and FM radio receiver upon detection of an occupied channel in a local FM frequency spectrum, in accordance with an embodiment of the invention.

FIG. 2C is a diagram illustrating the completion of channel scanning process of the integrated FM transmitter and FM radio receiver in a local FM frequency spectrum, in accordance with an embodiment of the invention.

FIG. 3A is a diagram illustrating a dynamic scanning process of an integrated FM transmitter and FM radio receiver in a frequency spectrum, in accordance with an embodiment of the invention.

FIG. 3B is a diagram illustrating a dynamic local FM channel tuning process to an alternate transmission channel based on ranked channel input or arbitrary tuning in an integrated FM transmitter and FM radio receiver, in accordance with an embodiment of the invention.

FIG. 5A is an exemplary diagram illustrating dynamic detection of occupied or unoccupied local FM channels, in accordance with an embodiment of the invention.

FIG. 5B is an exemplary diagram illustrating extraction of unoccupied local FM channels available for transmission, in accordance with an embodiment of the invention.

FIG. 5D is an exemplary diagram illustrating dynamic detection of occupied or unoccupied local FM channels when location or time changes, in accordance with an embodiment of the invention.

FIG. 5E illustrates an exemplary dynamic process of updating a FM channels list available for transmission, in accordance with an embodiment of the invention.

DETAILED DESCRIPTION OF THE INVENTION

Certain embodiments of the invention may be found in a method and system for detecting channels suitable for FM transmission in an integrated FM transmit receive (FM Tx/Rx) system. The integrated FM transmit receive (FM Tx/Rx) system may comprise a FM radio receiver and a FM radio transmitter. In an aspect of the invention, the FM communication system may comprise adjusting a tuning frequency of a FM radio receiver for scanning and detecting an FM channel based on knowledge of location of the FM radio receiver's received signal strength indicator (RSSI), a pause in a transmitted FM stream, a stereo pilot signal and/or carrier error of a related FM signal. The aforementioned information may be derived from preprogrammed information, updated from a previous scan, and/or received from one or more external inputs and may be used to configure the FM radio receiver for current or subsequent selective tuning. In another aspect of the invention, the selective channel tuning of the receiver may be dynamic and may bypass a plurality of available channels without performing a full scan.

Figure 1A:
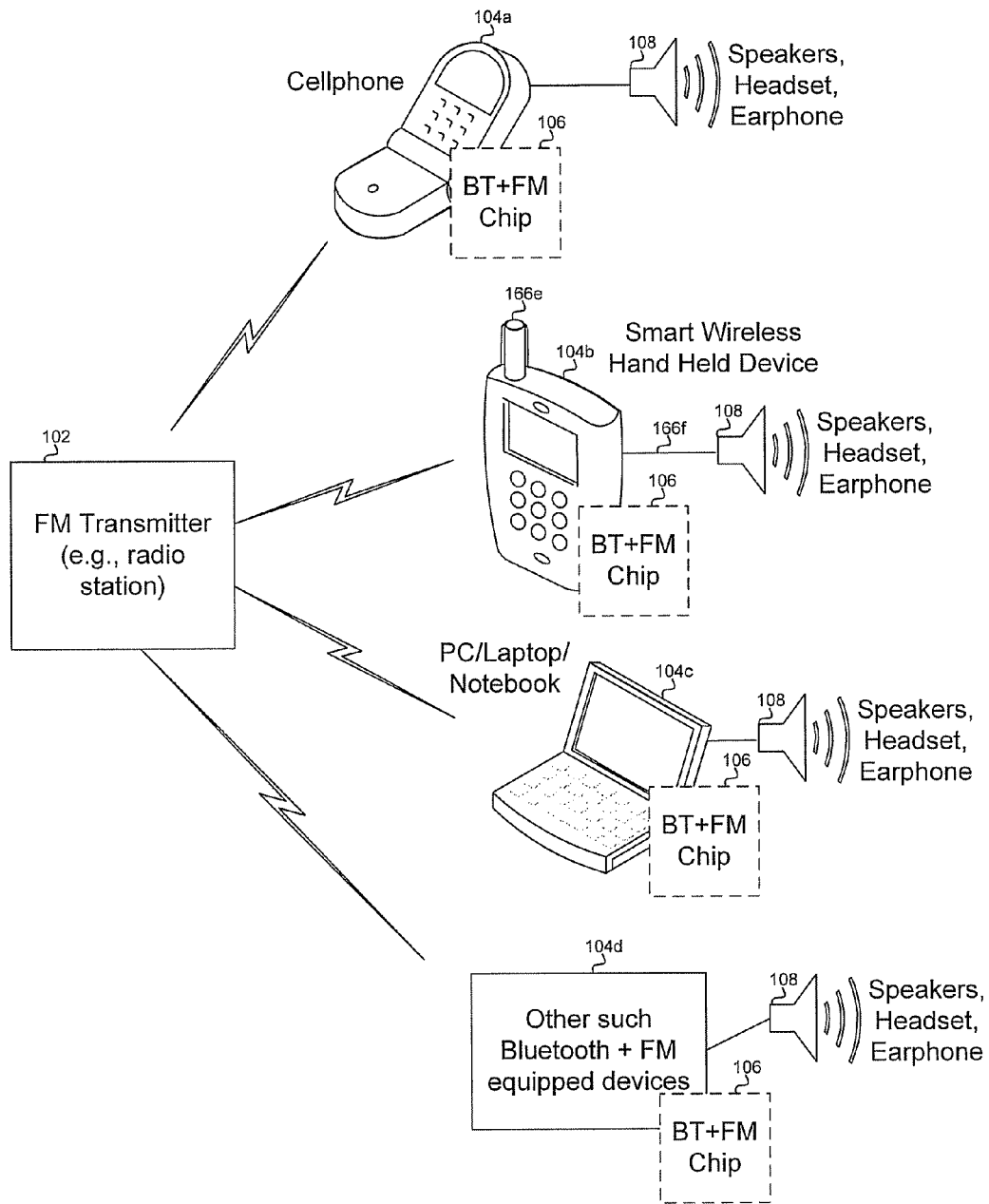
FIG. 1A is a block diagram of an exemplary integrated FM transmitter and FM radio receiver that communicates with devices with FM radio receivers, in accordance with an embodiment of the invention.

FIG. 1A is a block diagram of an exemplary integrated FM radio transmitter and FM radio receiver that communicates with devices with FM radio receivers, in accordance with an embodiment of the invention. Referring to FIG. 1A, there is shown an FM transmitter 102, a plurality of integrated FM radio transmitter and FM radio receivers such as a cellular phone 104a, a smart wireless hand held device 104b, a computer 104c, and an exemplary FM and Bluetooth-equipped device 104d. The FM radio transmitter 102 may be implemented as part of a radio station or other broadcasting device, for example. Each of the cellular phone 104a, the smart wireless hand held device 104b, the computer 104c, and the exemplary FM and Bluetooth-equipped device 104d may comprise a single chip 106 with integrated FM and Bluetooth radios for supporting FM and Bluetooth data communications. The integrated Bluetooth data communication may be included as an optional feature in the exemplary FM radio devices. The FM radio transmitter 102 may enable communication of FM audio data to the devices shown in FIG. 1A by utilizing the single chip 106. Each of the plurality of integrated FM radio transmitter and FM radio receiver devices in FIG. 1A may comprise and/or may be communicatively coupled to a listening device 108 such as a speaker, a headset, or an earphone, for example. In other embodiments of the invention, the functions of the single chip 106 may be implemented as discrete components.

The cellular phone 104a may be enabled to receive an FM transmission signal from the FM radio transmitter 102. The user of the cellular phone 104a may then listen to the transmission via the listening device 108. The cellular phone 104a may comprise a "one-touch" programming feature that enables pulling up specifically desired broadcasts, like weather, sports, stock quotes, or news, for example. The smart wireless hand held device 104b may be enabled to receive an FM transmission signal from the FM radio transmitter 102. The user of the smart wireless hand held device 104b may then listen to the transmission via the listening device 108. In an embodiment of the invention, the wire 166f connecting the smart wireless hand held device 104b to the listening device 108 may function as an external antenna similar to the antenna 166e for FM transmission and/or reception.

The computer 104c may be a desktop, laptop, notebook, tablet, and a PDA, for example. The computer 104c may be enabled to receive an FM transmission signal from the FM radio transmitter 102. The user of the computer 104c may then listen to the transmission via the listening device 108. The computer 104c may comprise software menus that configure listening options and enable quick access to favorite options, for example. In one embodiment of the invention, the computer 104c may utilize an atomic clock FM signal for precise timing applications, such as scientific applications, for example. While a cellular phone, a smart phone, computing devices, and other devices have been shown in FIG. 1A, the single chip 106 may be utilized in a plurality of other integrated FM radio transmitter and FM radio receiver devices and/or systems that receive and use FM and/or Bluetooth signals. In one embodiment of the invention, the single chip FM and Bluetooth radio may be utilized in a system comprising a WLAN radio. The U.S. application Ser. No. 11/286,844, filed on Nov. 22, 2005, discloses a method and system comprising a single chip FM and Bluetooth radio integrated with a wireless LAN radio, and is hereby incorporated herein by reference in its entirety. In another embodiment of the invention, the devices 104a to 104d shown in FIG. 1A may comprise a Global Positioning System (GPS) receiver to receive device location information.

Figure 1B:
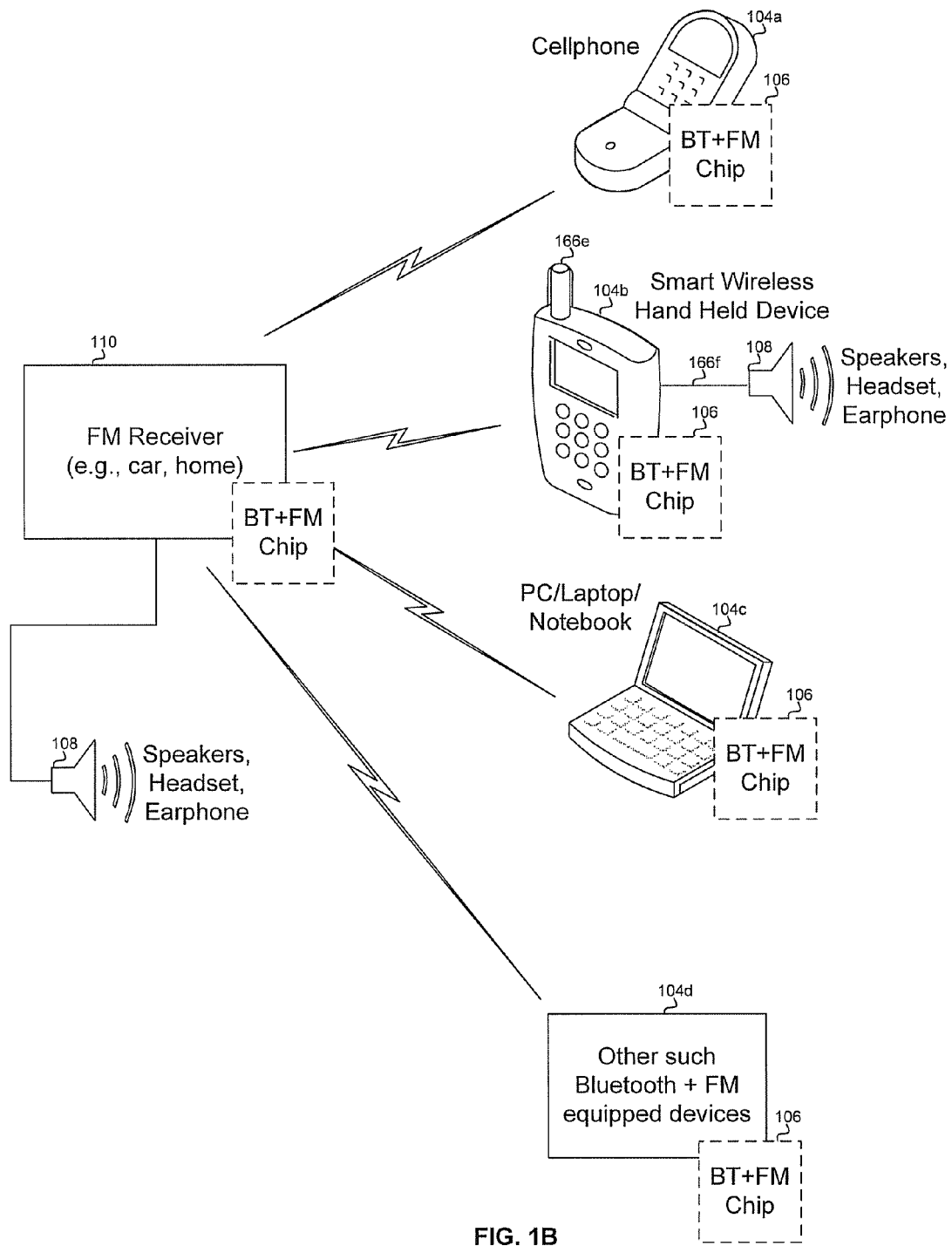
FIG. 1B is a block diagram of an exemplary integrated FM transmitter and FM radio receiver that communicates with devices transmitting a plurality of FM channels, in accordance with an embodiment of the invention.

FIG. 1B is a block diagram of an exemplary integrated FM radio transmitter and FM radio receiver that communicates with devices transmitting a plurality of FM channels, in accordance with an embodiment of the invention. Referring to FIG. 1B, there is shown an FM radio receiver 110, a plurality of integrated FM radio transmitter and FM radio receivers such as the cellular phone 104a, the smart wireless hand held device 104b, the computer 104c, and the exemplary FM and Bluetooth-equipped device 104d. In this regard, the FM radio receiver 110 may comprise and/or may be communicatively coupled to a listening device 108 using a wired connection or optional Bluetooth enabled technology. A device equipped with the Bluetooth and FM transceivers, such as the single chip 106, may be able to broadcast its respective signal to a "deadband" of an FM radio receiver for use by the associated audio system.

For example, a cellphone or a smart phone, such as the cellular phone 104a, may transmit a telephone call for listening over the audio system of an automobile, via usage of a deadband area of the car's FM stereo system. In another example, the smart wireless hand held device 104b, may play media content such as songs to the car's FM stereo system through broadcasting its media content to a selected FM channel with least FM local channels interference. In an embodiment of the invention, the wire 166f connecting the smart wireless hand held device 104b to the listening device 108 may function as an external antenna for FM reception while the antenna 166e may be used for FM transmission and/or reception.

One advantage may be the universal ability to use this feature with all automobiles equipped simply with an FM radio with few, if any, other external FM transmission devices or connections being required.

In another example, a computer, such as the computer 104c, may comprise an MP3 player or another digital music format player and may broadcast a signal to the deadband of an FM radio receiver in a home stereo system. The music on the computer may then be listened to on a standard FM radio receiver with few, if any, other external FM transmission devices or connections. While a cellular phone 104a, a smart wireless hand held device 104b, and computing devices 104c have been shown, a single chip 106 that combines an optional Bluetooth and FM transceiver and/or receiver may be utilized in a plurality of other devices and/or systems that transmit and/or receive FM signal.

Figure 1C:
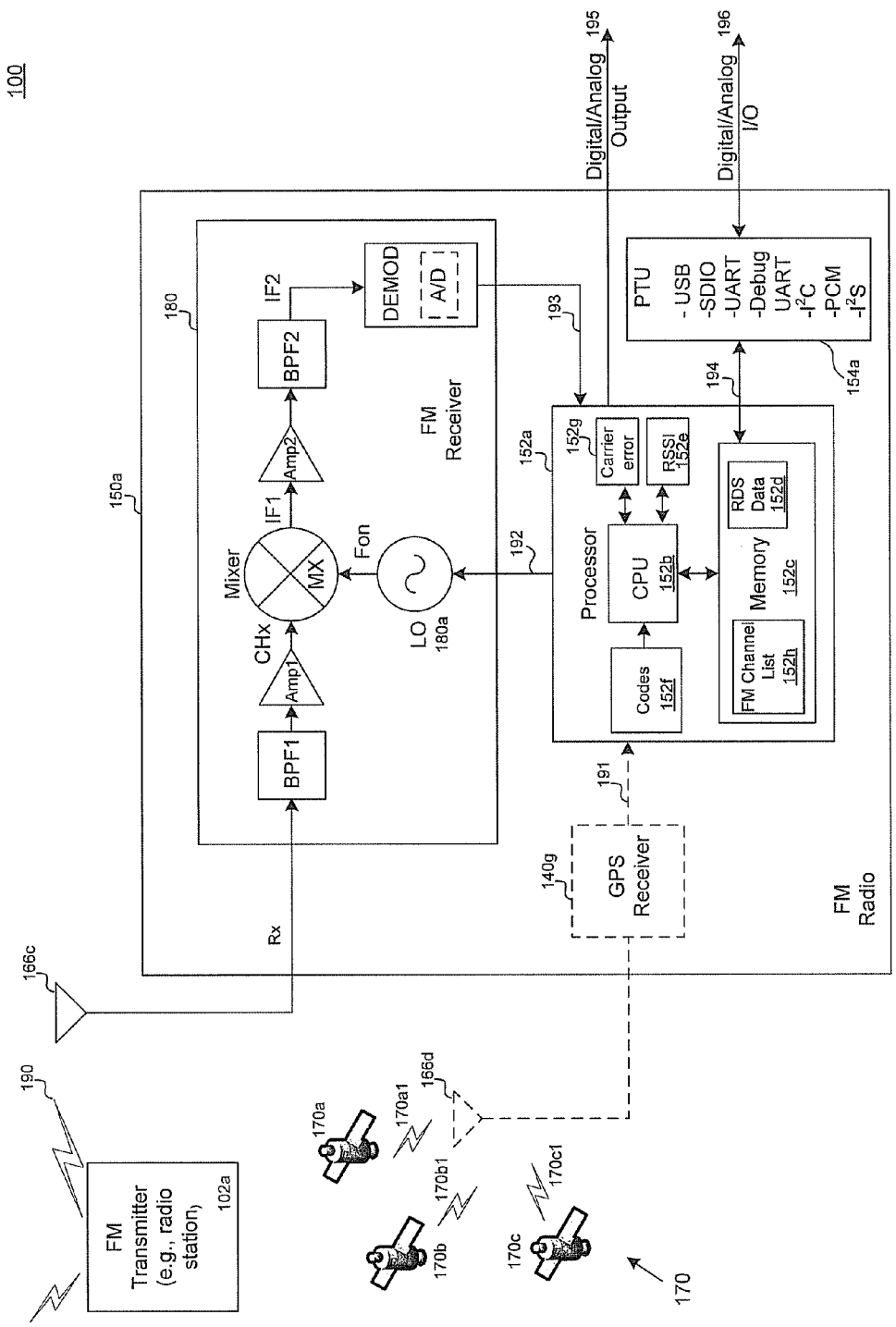
FIG. 1C is a block diagram of an exemplary FM communication system where an exemplary FM radio receiver communicates with a FM transmitter to identify a plurality of local FM channels, in accordance with an embodiment of the invention.

FIG. 1C is a block diagram of an exemplary FM communication system where an exemplary FM radio receiver communicates with a FM radio transmitter to identify a plurality of local FM channels, in accordance with an embodiment of the invention. Referring to the FM communication system 100 in FIG. 1C, there is shown a FM radio transmitter or radio broadcast station 102a, an exemplary FM radio 150a, and an optional GPS system 170.

The FM radio transmitter 102a may comprise at least a frequency source, an amplifier, an antenna and a processor with suitable logic, circuitry, and/or code that enable transmission of FM signals 190 by frequency modulation scheme. The FM signals 190 may be broadcasted in the RDS/RBDS standard comprising information identifying such as alternate frequencies of programs being broadcasted by the station 102a, channel spacing, the clock time, broadcasted program identification with known station ID, country code or country identity, regional links and Enhanced Other Networks (EON) etc. The RDS data 152d may be stored and retrieved from a memory 152c of the FM radio 150a for dynamic tuning input and for validating occupied local FM channels being broadcasted.

The exemplary FM radio 150a may be part of an integrated FM radio transmitter (FM Tx) and FM radio receiver (FM Rx). The FM radio transmitter portion may not be shown in this block diagram since exemplary channel identifications by the FM radio receiver 180 are being described. The FM radio receiver 180 may comprise an antenna 166c, an optional GPS receiver 140g with an optional GPS antenna 166d, a processor 152a and a Peripheral Transport Unit (PTU) 154a. In an embodiment of the invention, the functions of the exemplary FM radio 150a may be implemented with discrete components. In an alternate embodiment, the exemplary FM radio 150a may be implemented as a single chip integrating the optional GPS receiver 140g, the FM radio receiver 180, the processor 152a and the PTU 154a on the same chip.

The FM radio receiver 180 may be coupled to the antenna 166c to communicate FM signals 190 from the FM radio transmitter 102a. The FM radio receiver 180 may comprise a first and second band pass filters BPF1 and BPF2, a first and second amplifiers AMP1 and AMP2, a local oscillator LO, a mixer MX, a demodulator DEMOD and optionally an analog to digital converter A/D.

The first band pass filter BPF1 may substantially suppresses most of unwanted out of band FM signals 190. The first amplifier AMP1 may be a low noise amplifier that amplifies the filtered FM signal level as channel signals CHx. The channel signals CHx, also known as the occupied local FM channels being frequency modulated carrier signals, may each be spaced apart at the center frequency by a defined channel frequency separation. The channel signals CHx may also be separated by multiples of the defined channel frequency separations. The channel signals CHX may commonly be down converted for the ease of signal processing using a mixer MX by mixing the channel signals CHX of suitable amplitude exceeding a RSSI threshold with a high side or low side local oscillator LO at frequencies Fon to produce a lower intermediate frequency signal IF1 of a defined offset suitable for demodulation or signal processing.

In an embodiment of the invention, the frequency Fon of the local oscillator LO 180a may be dynamically tuned or adjusted upward or downward in response to an input 192 from the processor 152a. Such dynamic frequency adjustment may be known as channel tuning or scanning for local FM channel identification. The channel tuning or scanning may be used to identify both occupied and unoccupied local FM channels. If tuning to a channel CHX with a valid signal that exceeds the RSSI threshold and/or identified by the RDS/ RDBS data occurs, the channel CHX may be an occupied local FM channel that may not be available for transmission by the radio 150a. Conversely, if tuning to a channel CHX with a signal below the RSSI threshold and/or identified by the RDS/RDBS data occurs, the channel CHX may be an unoccupied local FM channel available for transmission by the radio 150a. Besides the use of RSSI and RDS/RDBS data for channel CHX identification, transmission pauses of a received signal in combination with RSSI threshold may also be used for channel CHX identification or detection. The method of detection and identification is not limited to the examples provided.

In an embodiment of the invention, the LO 180a may scan across an entire local oscillator LO 180a tuning range by tuning the local oscillator LO 180a from the lowest frequency to the highest frequency or vice versa. When a potential channel signal CHx is detected within the LO 180a tuning range, an intermediate frequency signal IF1 may be detected (identified occupied local FM channel being transmitted).

The output signal IF1 of the mixer MX may comprise other undesirable mixing products as sidebands above or below the desired signal IF1. Due to conversion loss in the mixing process, the signal IF1 may be further amplified by amplifier AMP2 and filtered by filter BPF2 to yield a signal IF2 substantially lack of sideband or spurious signals of detectable amplitude. The signal IF2 is suitable for signal processing. The signal IF2 may be demodulated by demodulator DEMOD and optionally processed by an A/D to produce a digital signal 193 used as an input to be further processed by the processor 152a. In an alternate embodiment of the invention, the signal IF2 may be demodulated and used as an input directly into the processor 152a. A general relationship of the signals CHx, Fon and IF2 may be shown as:

$$IF2 = Abs(Fon - CHx)$$

where the signal IF2 is an intermediate frequency. It may be shown that if the frequency of the LO signal Fon varies during the scanning process, the frequency of the signal IF2 may change by the same quantity. If the channel signal CHx is successfully detected, the signal IF2 should be substantially the same or close to a defined offset unique to the FM radio receiver 180. Thus, the offset is kept at a substantially constant value from channel to channel where the adjacent channels are separated by one or more multiples of channel spacing.

One of the tuned conditions may be a small carrier error $152g$. A carrier error $152g$ may be generated if the frequency difference between the offset and the signal IF2 exceeds a certain limit. The magnitude of the carrier error $152g$ in combination with the logic level of RSSI may be used to for tuning even or odd channels of signals CHx or for channel spacing adjustment determination during scanning. The carrier error may be shown as:

Carrier Error=Offset−IF2.

If the carrier error $152g$ becomes too large, and the signal RSSI level is low, the channel may be ignored or by-passed for a next tuning selection. The channel frequency and channel spacing information may be updated in the processor $152a$ or stored in the memory $152c$. If the carrier error $152g$ becomes too large, but the signal RSSI level is high, the processor $152a$ may mark the channels signals CHX to be tuned as even or odd channels using the same channel spacing. U.S. application Ser. No. 11/755,395 filed on May 30, 2007, discloses an exemplary tuning process and measurement of offsets and channel spacing and is hereby incorporated herein by reference in its entirety.

Occasionally the received FM signal 190 as channel signal CHX may be out of tune due to transmitter's frequency instability causing certain carrier error $152g$. A phase locked loop circuit may be implemented in the local oscillator LO $180a$ circuit to automatically track out the carrier error by periodically adjusting the local oscillator LO $180a$ tuning frequency Fon such that the signal IF2 may be kept at a substantially constant frequency and the carrier error substantially small.

The optional GPS receiver $140g$ utilizes GPS time coded signals $170a1$, $170b1$ and $170c1$ from GPS satellites $170a$, $170b$ and $170c$ in space orbits. The time coded signals $170a1$ to $170c1$ may determine the location or position of the GPS receiver $140g$ based on time differences received from the GPS satellites $170a$ to $170c$. The location information may be used as a form of input to identity the FM radio transmitter $102a$. Once the relative location of the FM radio transmitter $102a$ is determined, the frequencies and other characteristics of the FM signals being broadcasted may be identified based on a look up table in the memory $152c$ of the processor $152a$ or from other external inputs 196 to be discussed later.

The processor $152a$ may comprise a CPU $152b$, the memory $152c$, suitable logic, circuitry, and/or code $152f$ that may enable control and/or management of tuning operations or process RSSI function $152e$ in the FM radio receiver 180. The processor $152a$ may process a plurality of inputs such as GPS input 191, demodulated channel signal input 193 or input 194 from PTU $154a$. The processor $152a$ may also generate outputs 192, 194 and 195. The output 192 may dynamically tune or adjust the local oscillator LO frequency Fon. The output 194 to PTU may communicate to other external devices, output 195 as digital or analog signals.

The CPU $152b$ may comprise suitable logic, circuitry, and/or code that may enable control and/or management of inputs and output operations. In this regard, the CPU $152b$ may communicate control and/or management operations to the FM radio receiver 180, and/or the PTU $154a$ via a set of register locations specified in a memory map or RDS/RDBS data $152d$ in memory $152c$. The CPU $152b$ may enable processing of data 193 received via the FM radio receiver 180, and/or data 194 via the PTU $154a$.

For example, the CPU $152b$ may enable configuration of data routes to and/or from the FM radio receiver 180. For example, the CPU $152b$ may configure the FM radio receiver 180 such as flexible tuning, and/or searching operations in FM communication by bypassing predetermined channels. For example, the CPU $152b$ may generate at least one output signal that tunes the FM radio receiver 180 to a certain frequency to determine whether there is an available channel for FM transmission or an occupied local FM channel at that frequency already being used (unavailable for transmission). When a station is found, the CPU $152b$ may configure a path for the audio signal to be updated in the memory $152c$ in the FM channel list $152h$ and to be processed in the FM radio $150a$. When a station is not found, the channel may be marked as unoccupied local FM channel available for FM transmission in the FM channel list $152h$. The CPU $152b$ may generate at least one additional signal that tunes the FM radio receiver 180 to a different frequency to determine whether a station or occupied local FM channel may be found at the new frequency.

RSSI function $152e$ or RDS/RDBS data $152d$ may be utilized in combination with codes $152f$ as a search algorithm for processing by the CPU $152b$. The search algorithm may enable the FM radio receiver 180 to scan up or down in frequency from a presently tuned or identified occupied local FM channel, and may tune in to the next available channel using RSSI function $152e$ to detect signals meeting above a detection threshold. The search algorithm may be able to distinguish image channels. The choice of the IF frequency during search is such that an image channel may have a nominal frequency error of 50 kHz, which may be used to distinguish the image channel from the "on" channel or occupied local FM channel. The search algorithm may also be able to determine if a high side or a low side injection provides better receive performance, thereby allowing for a signal quality metric to be developed for this purpose. One possibility to be investigated is monitoring the high frequency RSSI relative to the total RSSI. The IF frequency may be chosen so that with the timing accuracy that a receiver may be enabled to provide, the image channels may comprise a frequency error that is sufficiently large to differentiate the image channels from the "on" channel or occupied local FM channel.

The memory $152c$ may comprise suitable logic, circuitry, and/or code that may enable data storage. In this regard, the memory $152c$ may be utilized to store RDS/RDBS data $152d$ and a FM channel list $152h$. A RSSI function $152e$ information may be utilized by the processor $152b$ to control and/or manage the tuning operations of the FM radio $150a$. The RDS/RDBS data $152d$ or RSSI function $152e$ information may be received via the PTU $154a$ and/or via the FM radio receiver 180. The FM channel list $152h$ may comprise one or more tables of local FM channels.

In an embodiment of the invention, the FM channel list $152h$ may comprise a first updated table listing local FM channels in the area, both occupied and unoccupied local FM channels. A second updated table may be derived from the first updated table with a list of occupied local FM channels unavailable for FM transmission. The second updated table may be ranked according to RSSI level for neighboring channel interference analysis.

A third updated table may be derived from the first updated table with a list of unoccupied local FM channels available for FM transmission. A fourth updated table may be derived from the third updated table where the unoccupied local FM channels may be ranked based on the extent of neighboring occupied local FM channels interferences from the second table. The ranking of unoccupied local FM channels may be used for FM transmission priorities. The FM channel list 152h may be dynamically updated based on knowledge of occupied local FM channels.

The PTU 154a may comprise suitable logic, circuitry, and/or code that may enable communication to and from the FM radio 150a via a plurality of communication interfaces. In some instances, the PTU 154a may be implemented outside the FM radio 150a, for example. The PTU 154a may support analog and/or digital communication with at least one port. For example, the PTU 154a may support at least one universal series bus (USB) interface that may be utilized for Bluetooth data communication, at least one secure digital input/output (SDIO) interface that may also be utilized for Bluetooth data communication, at least one universal asynchronous receiver transmitter (UART) interface that may also be utilized for Bluetooth data communication, and at least one I$^2$C bus interface that may be utilized for FM control and/or FM and RDS/RDBS data communication. The PTU 154a may also support at least one PCM interface that may be utilized for Bluetooth data communication and/or FM data communication, for example.

The PTU 154a may also support at least one inter-IC sound (I$^2$S) interface, for example. The I$^2$S interface may be utilized to send high fidelity FM digital signals to the CPU 152b for processing, for example. In this regard, the I$^2$S interface in the PTU 154a may receive data from the FM radio receiver 180 via a bus, for example.

The RDS/RDBS data 152d may be buffered in the memory 152c in the processor 152a. The RDS/RDBS data 152d may be transferred from the memory 152c via the I$^2$C interface when the CPU 152b is in a sleep or stand-by mode. For example, the FM radio receiver 180 may post RDS/RDBS data 152d into a buffer in the memory 152c until a certain level is reached and an interrupt is generated to wake up the CPU 152b to process the RDS/RDBS 152d. When the CPU 152b is not in a sleep mode, the RDS/RDBS data 152d may be transferred to the memory 212 via the common bus 201, for example.

In one embodiment of the invention, the FM radio 150a may implement a search algorithm that collects and stores data during scanning of the local FM channels. The FM radio 150a may determine whether there is music or speech in a detected channel. Moreover, the FM radio receiver 180 may enable searching and finding of the strongest channels CHX or signals, for example, and may rank those channels CHX as potential interfering neighboring FM channels. The RSSI of the potential interfering neighboring FM channels in combination with channel spacing information to an unoccupied FM channel may be used to rank the suitability of the unoccupied FM channel for transmission by the FM radio 150a with the integrated FM radio transmitter and FM radio receiver.

In another embodiment of the invention, the FM radio 150a may implement a search algorithm where the searches may be done based on specific criteria such as type of station or type of music, for example. The single chip may characterize each of the stations found based on the search.

In an alternate embodiment of the invention, the FM radio 150a may be implemented in FM radios, cellular phones, MP3 players, TV tuners, wireless LAN (WLAN) radio, PDAs, handheld wireless communication devices, laptop computers or any wireless communication devices.

FIG. 2A is a diagram illustrating an initial scanning process for channel tuning of an integrated FM radio transmitter and FM radio receiver in a local FM frequency spectrum, in accordance with an embodiment of the invention. Referring to FIG. 2A, there is shown a plurality of signals representing occupied local FM channels CH1 202a to CH5 202e and a local oscillator LO signal Fon as described in FIG. 1C.

In the absence of initial input from the memory 152c to the CPU 152b in the FM radio 150a, a local oscillator LO 180a at initial tuning frequency Fon during turn on, may tune upward or downward across the entire LO tuning range. For channel processing or detection, the FM radio receiver 180 may determine local FM channel spacing to enable expedient LO tuning between channels. The LO 180a may attempt to generate an IF signal after the Mixer MX, where IF2=Abs (Fon−CHx) as described with regard to FIG. 1C. Signals CH1 202a to CH5 202e may represent a plurality of consecutive local FM channels within the tuning range of the local oscillator LO 180a.

The FM radio receiver processor 152a may utilize the RSSI function 152e that may be enabled to set a detection threshold 206 for occupied local FM channels CH1 202a to CH5 202e. In certain instances, the signal CH2 202b being below the detection threshold 206, the RSSI may be set to low. In an embodiment of the invention, signal CH2 202b with low RSSI may be updated and marked as invalid channel in the FM channel list 152h or as an unoccupied local FM channel available for local FM transmission by the integrated FM radio transmitter and FM radio receiver device such as the radio 150a. These channel information, once identified may be used to update the FM channel list 152h for future tuning request where signal CH2 202b may either be bypassed for FM reception purpose or dynamically selected for FM transmission purpose without a full scanning process.

FIG. 2B is a diagram illustrating a local FM channel scanning process of the integrated FM radio transmitter and FM radio receiver upon detection of an occupied channel in a local FM frequency spectrum, in accordance with an embodiment of the invention. Referring to FIG. 2B, there is shown five consecutive signals CH1 202a to CH5 202e separated by substantially equal channel spacing S1 208a to S4 208d. In some instances, channel spacing S1 208a to S4 208d may also be referred as channel offsets. Channel spacing may vary from country to country and from local FM station to FM station. In an embodiment of the invention, channel spacing S1 208a to S4 208d may each be separated by 100 KHz. In another embodiment, channel spacing S1 208a to S4 208d may each be separated by 200 KHz. In other embodiments, the channel spacing may be other larger or smaller values.

In an embodiment of the invention, for local FM channel assignment in the FM channel list 152h of FM radio receiver memory 152c, signals CH1 202a, CH3 202c and CH5 202e may be recorded as odd channels. Similarly signals CH2 202b and CH4 202d may be recorded as even channels.

In the process of scanning for occupied local FM channel detection, the local oscillator LO 180a as described in FIG. 1C may tune from the lower frequency range to upper frequency range or vice versa. The FM radio receiver 180 may set a frequency offset 210 as a reference value to process a carrier error 152g. If signal CH1 202a is successfully tuned to, an IF frequency signal IF2, where IF2=Abs (Fo1−CH1) may be substantially equal to the designated offset 210 of the FM radio receiver 180, FIG. 2C is a diagram illustrating the completion of channel scanning process of the integrated FM radio transmitter and FM radio receiver in a local FM frequency spectrum, in accordance with an embodiment of the invention. Referring to FIG. 2C, there is shown a linear tuning process that may require the local oscillator LO 180a as described in FIG. 1C to scan through frequencies Fo1 204a, Fo3 204c and Fo4 204d to first tune through the respective occupied lower FM local channels CH1, CH3 and CH4 before reaching the final channel CH5 202e at the LO frequency Fo5 204e. Signal channel CH2 202b may not be tuned or purposely skipped over upon detection that the signal CH2 202b RSSI is set to low during the scanning process. Channels CH1, CH3, CH4 and CH5 may be updated as occupied local FM channels recorded with respective RSSI level for neighboring channels interference determination. Channel CH2 may be marked as unoccupied local FM channels available for local FM transmission in the FM channel list 152h.

During a future or periodic scanning for occupied local FM channels, carrier error 152g in each of the channel signals CH1 202a to CH5 202e may be checked at the respective IF frequencies in the FM radio receiver 180. Since the channel spacing S1 to S4 are constant, the LO may tune with step sizes of equal channel spacing S1 to S4. Since the RSSI 152e function residing in the processor 152a of the FM radio 150a may ignore any signal below RSSI detection threshold 206, thus the LO 180a may skip the tuning of channel CH2 202b for occupied local FM channel verification. The FM channel list 152h may be a database comprises of a list of occupied local FM channels unavailable for local FM transmission with respective recorded RSSI level, and/or a list of unoccupied local FM channels available for local FM transmission stored in the memory 152c.

Conversely, a future or periodic scanning may be performed solely on the unoccupied local FM channels for update or confirmation of the list may still be valid, or dynamically re-ranking the unoccupied channels in the list when necessary. The FM channel list 152h of the FM radio receiver memory 152c may be updated in each scan operation where the updated information may be used to speed up alternate channel FM transmission tuning.

FIG. 3A is a diagram illustrating a dynamic scanning process of an integrated FM radio transmitter and FM radio receiver in a frequency spectrum, in accordance with an embodiment of the invention. In FIG. 3A, an initial suitable transmission channel CH2 302b may receive interferences from strong interfering neighboring channels CH1 302a and CH3 302c or due to the channel CH2 302b no longer available such as being occupied by a local FM broadcast station. This situation may occur when the FM radio 150a (as shown in FIG. 1C) may be relocated to a new location or in an environment with heavy FM channel traffics. The LO 180a of the FM radio receiver 180 at frequency Fon may perform a full scan starting from CH1 302a to recheck and update the local FM channel list 152h.

FIG. 3B is a diagram illustrating a dynamic local FM channel tuning process to an alternate transmission channel based on ranked channel input or arbitrary tuning in an integrated FM radio transmitter and FM radio receiver, in accordance with an embodiment of the invention. Referring to FIG. 3B, alternately in this example a full scan may not be performed as in FIG. 3A, instead the FM radio receiver 180 may dynamically "jump" to a next suitable transmission channel CH4 302d based on channel ranking from the local FM channel list 152h.

In another embodiment, the LO 180a of the FM radio receiver 180 may arbitrarily "tune on the fly" to channel CH4 302d without relying on prior information from the local FM channel list 152h while the FM radio transmitter may be tuned to the same channel CH4 302d before or after the FM radio receiver 180 reaches channel CH4 302d to verify its transmission availability. In both instances, the LO 180a may by-pass tuning to LO frequencies Fo1 304a to Fo3 304c and settle on Fo4 304d without a rescanning. The channel ranking and the FM channel list 152h may be updated dynamically based on the availability verification or non interfering detection by the FM radio receiver 180. Further description on the generating and ranking of the FM channel list 152h may be illustrated in FIGS. 5a to 5E.

Figure 4:
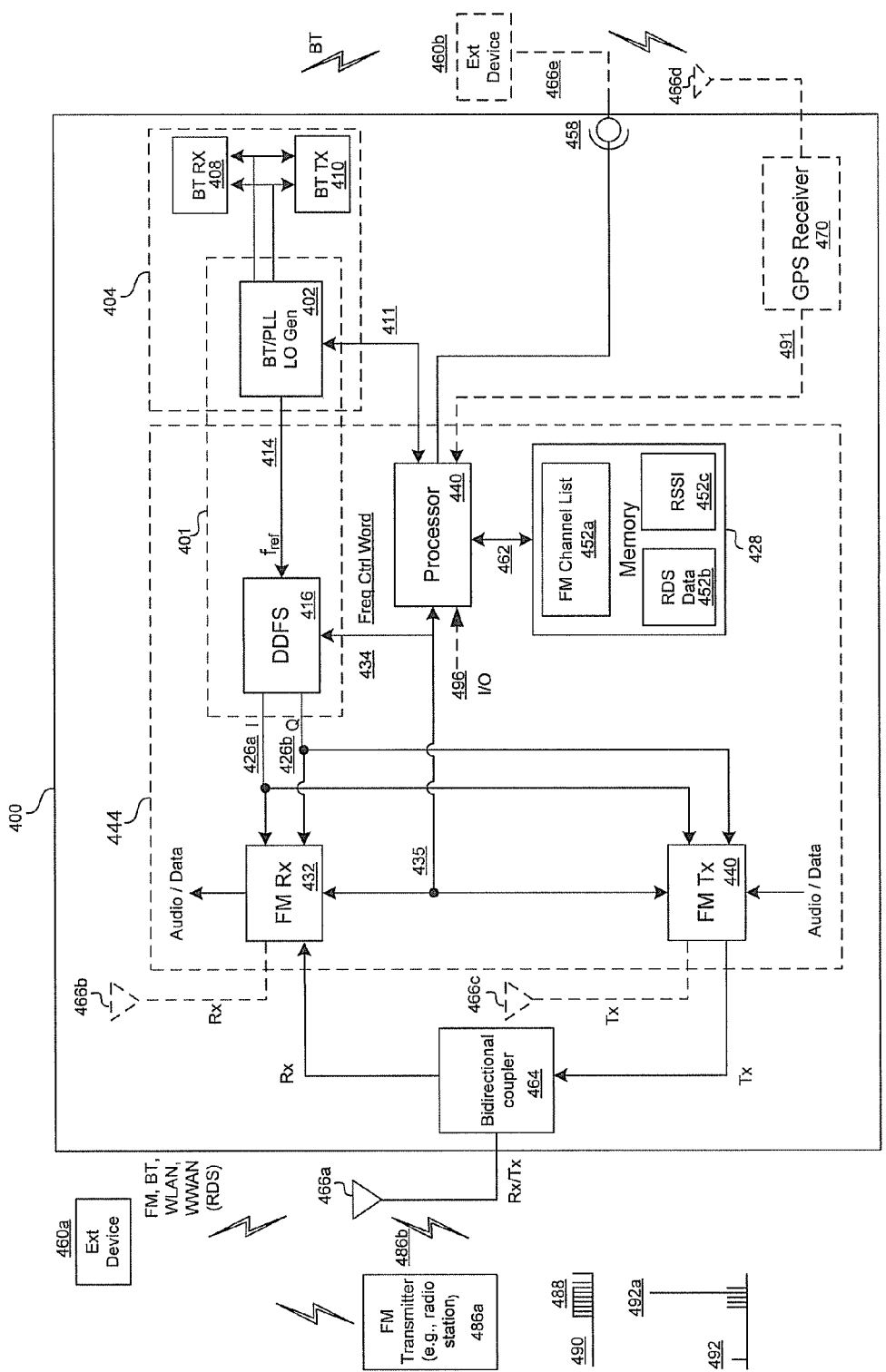
FIG. 4 is an exemplary diagram of a wireless communication Integrated FM Tx/Rx on a Chip (SOC) with integrated Bluetooth (BT) transceiver and FM transceiver, in accordance with an embodiment of the invention.

FIG. 4 is an exemplary diagram of a wireless communication Integrated FM Tx/Rx system 400 with integrated Bluetooth (BT) transceiver 404 and FM transceiver 444, in accordance with an embodiment of the invention. Referring to FIG. 4, there is shown a FM transmitter 486a communicating FM channels 486b to the Integrated FM Tx/Rx system 400. The Integrated FM Tx/Rx system 400 may be a System On a Chip (SOC) that may comprise a BT transceiver 404 and an FM transceiver 444 with an integrated clock generator 401. The BT transceiver 404 may comprise a BT/PLL LOGEN circuit 402, a BT receiver circuit BT RX 408, a BT transmit circuit BT TX 408, and suitable logic, circuitry, and/or code that may enable communicating with an external device 460b with a baseband processor.

Accordingly, the BT PLL/LOGEN circuit 402 may comprise a PLL utilized to generate a signal utilized in the communication of BT data. One or more control signals may be provided by the BT transceiver 404 to the processor 440 and/or the memory 428. Similarly, one or more control signals 411 may be provided by the memory 428 and/or the processor 440 to the BT transceiver 404. In this regard, digital information may be exchanged between the BT transceiver 404 and the FM transceiver 444. For example, changes in operating frequency of the BT PLL/LOGEN circuit 402 may be communicated to the memory 428 through control signal 411 and/or the processor 440 such that the frequency control word 434 to a DDFS 416 may be altered to compensate for the frequency change.

The FM transceiver 444 may comprise suitable logic, circuitry, and/or code that may enable the transmission and/or reception of FM signals. In this regard, the FM transceiver 444 may comprise a DDFS 416 clocked by the BT PLL/LOGEN circuit 402. Accordingly, the FM transceiver 444 may be enabled to utilize reference generated clock signal 414 of widely varying frequency. In this regard, the DDFS 416 may enable utilizing the output reference generated clock signal 414 of the BT PLL/LOGEN circuit 402 to generate signals utilized by the FM transceiver 444. In this manner, a reduction in power consumption and circuit size may be realized in the Integrated FM Tx/Rx system 400 by sharing a single BT PLL/LOGEN circuit 402 between the FM transceiver 444 and the BT transceiver 404.

In an exemplary operation of the Integrated FM Tx/Rx system 400, one or more signals such as signals 435 provided by the processor 440 may configure the FM transceiver 444 to either transmit or receive FM signals. To receive FM signals, the processor 440 may provide one or more signals 435 to power up the FM Rx block 432 and power down the FM Tx block 430. Additionally, the processor 440 may provide a frequency control word 434 to the DDFS 416 in order to generate an appropriate FM LO frequency (with IQ components 426a and 426b) based on the reference signal $f_{ref}$ 414. In this regard, $f_{ref}$ 414 may comprise an output of the BT PLLU-LOGEN circuit 402.

For example, the BT PLL/LOGEN circuit 402 may operate at 900 MHz and the DDFS 416 may thus utilize the 900 MHz signal to generate, for example, signals in the "FM broadcast band", or approximately 78 MHz to 100 MHz. The FM broadcast band may expand to cover wider range such as 60 to 130 MHz in some FM radio devices. In another embodiment of the invention, the FM transceiver 444 may be capable of receiving or transmitting higher frequencies such as the cellular to millimeter wave range using an exemplary super heterodyne radio architecture described in FIG. 1C.

The processor 440 may interface with the memory 428 in order to determine the appropriate state of any control signals and the appropriate value of the frequency control word 434 provided to the DDFS 416. To transmit FM signals the processor 440 may provide one or more signals 435 to power up the FM Tx block 430 and power down the FM Rx block 432. Additionally, the processor 440 may provide a frequency control word 434 to the DDFS 416 in order to generate an appropriate FM LO frequency (with IQ components 426a and 426b) based on the reference signal $f_{ref}$ 414. Alternatively, the processor 440 may provide a series of control words 434 to the DDFS 416 in order to generate a FM signal. In this regard, the processor 440 may interface with the memory 428 in order to determine the appropriate state of any control signals 435 and the appropriate values of the control word 434 provided to the DDFS 416.

The memory 428 may comprise a FM channel list 452a and RDS/RDBS data 452b. The FM channel list 452a may comprise one or more listings with dynamically updated local FM channels. The dynamically updated local FM channels may comprise detected occupied local FM channels (not available for local FM transmission) and/or unoccupied local FM channels (available for local FM transmission through FM Tx block 464). The RDS/RDBS 452b may comprise information identifying such as alternate frequencies of programs being broadcasted by local FM station, channel spacing, the number of blocks and frames transmitted (for BER determination), the clock time, broadcasted program identification with known station ID, country code or country identity, regional links and Enhanced Other Networks (EON) etc. The RDS/RDBS data 452b may be stored and retrieved from the memory 428 for dynamic tuning input and for validating occupied local FM channels being broadcasted.

In an embodiment of the invention, FM reception to detect local FM channels and FM channel transmission may be performed simultaneously by receiving control signals 435 from the processor 440 and coupling the FM Rx block 432 to an optional receive antenna 466b and the FM Tx block 440 coupling to an optional antenna 466c. Alternately, FM reception and FM transmission may be multiplexed by coupling the FM Rx block 432 and the FM Tx block 440 to an antenna 466a through a bidirectional coupler. The antennae 466a and 466c may be used to communicate local FM channel signals to an external device 460a through FM, sideband signal, Bluetooth BT, Wireless Local Area Network (WLAN) or Wireless Wide Area Network (WWAN).

In another embodiment of the invention, an optional GPS receiver 470 with antenna 466d may be coupled to the processor 440 as input 491 to provide country information or radio location information to assist in local FM channel and channel spacing determination. In another embodiment of the invention, the external device 460b may optionally be coupled to the Integrated FM Tx/Rx system 400 to receive signal through a wire 466d coupled to a plug and a jack connector 458. The wire 466 may be utilized as a reception antenna for the FM transceiver 444 while FM transmission may be performed through an internal antenna such as antenna 466c. Other inputs such as input 496 may serve similar functions as input 194 of FIG. 1C to facilitate channel tuning determination.

In another embodiment of the invention, pauses 490 of a transmission stream 488 may be an indication of a valid local FM channel being transmitted for dynamically generating or updating a local FM channel list 452a. A Pause frame may be used to halt the transmission of a sender for a specified period of time in a duplex communication mode where data may flow in both directions such as using FM Tx and FM Rx communication.

In another embodiment of the invention, a detection of a stereo pilot signal 492 (or pilot signal) may be used to identify a valid local FM channel 492a for dynamically generating or updating a local FM channel list 452a. The detection of a pilot signal 492 at a certain frequency may indicate a valid FM channel 492a may be detected at the second harmonics of the pilot signal 492. For example, a 19 kHz pilot signal may indicate the presence of an FM channel audio signal at 38 kHz.

Figure 4A:
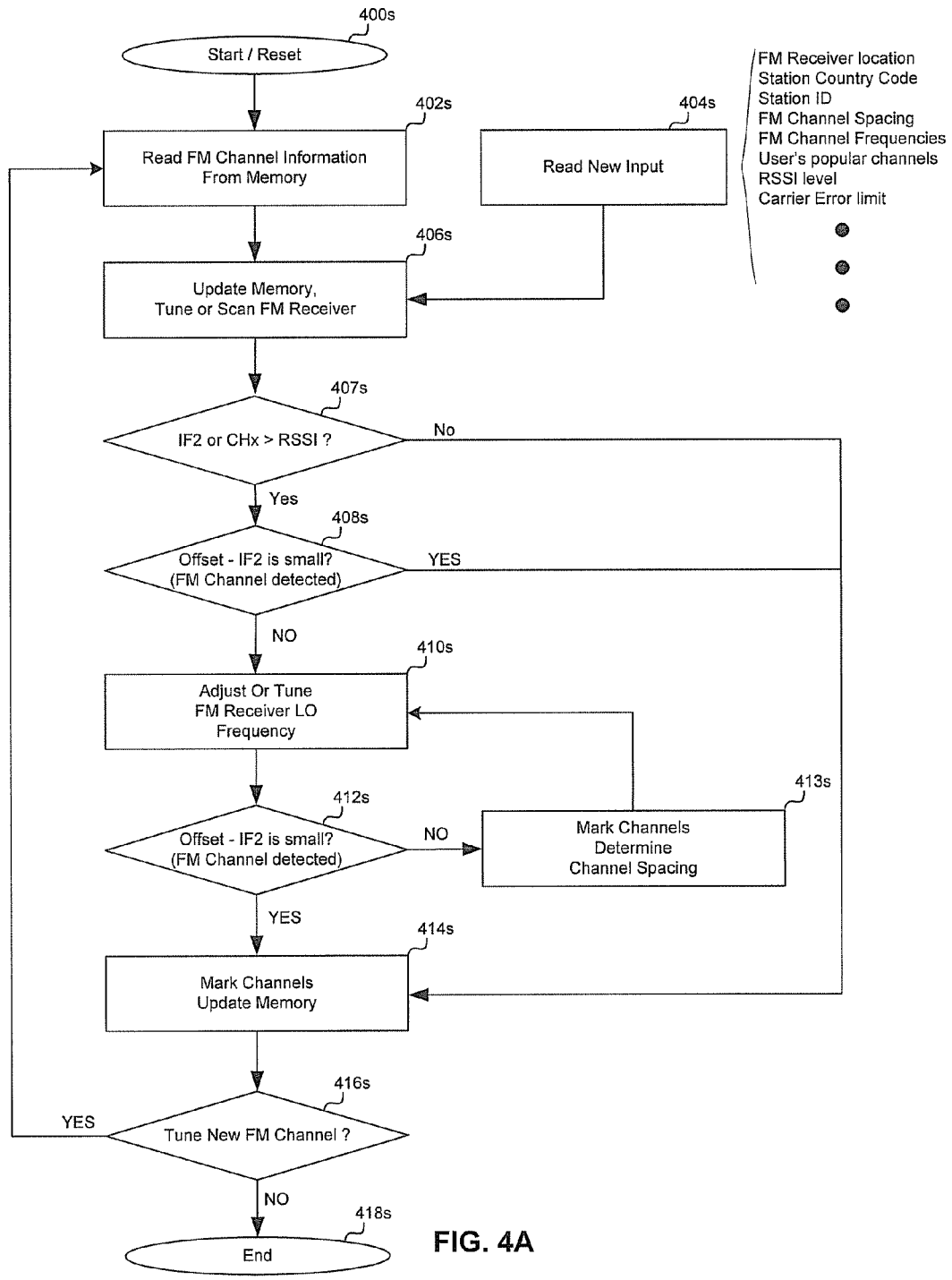
FIG. 4A is a flow chart that illustrates exemplary steps for processing receiver channel tuning in FM communication, in accordance with an embodiment of the invention.

FIG. 4A is a flow chart that illustrates exemplary steps for processing receiver channel tuning in FM communication, in accordance with an embodiment of the invention. Components in FIG. 1C may be referenced to throughout the flow charts description at various steps in both FIGS. 4A and 4B.

Step 400s represents an initial or a reset condition for a FM receiver 150a without knowledge of the location, channel frequencies and channel spacing information. In step 402s, a processor 152a may read any available RDS data 152d in a memory 152c. The FM receiver may start with a default channel setting for a station such as tuning the LO from the low end of the band. The RDS data may be derived from a previous scan or from stored information which may for example, be retrieved from a preprogrammed database. Concurrently in step 404s, new inputs 191, 193 or 194 comprising FM receiver location, station country code or country identity, station ID, FM channel spacing, FM channel frequencies, signal RSSI level, carrier error limit or any user inputs such as favorite channels may be communicated to update the memory 152c and to the processor 152a.

In step 406s, the processor generate an output 192 to tune the FM receiver local oscillator LO based on inputs from 191, 193 or 194 and from the updated memory 152c. The tuning output may facilitate scanning by tuning the LO in both direction (upward or downward) across a portion of or the entire tuning range. The tuning or scanning may comprise continuous tune or selective tuning by frequency hops.

In step 407s, the FM receiver 180 RSSI function checks if the generated IF signal IF2 or the channel signal CHx exceeds a RSSI threshold level. The signal IF2 being the absolute frequency difference between the LO Fon and the channel signal CHx.

In step 408s, if the IF signal IF2 or channel signal CHx exceeds the RSSI threshold level, the FM receiver 180 may determine whether any channel signal CHx is detected. Regarding step 408s, there may be different ways to measure a successful channel tuning. In one embodiment of the invention, a successful channel tuning occurs when the carrier error is small, such as the difference of the offset and the IF frequency (IF2) being substantially small as earlier described in FIG. 1C.

In step 410s, the processor 152a may generate an output to adjust the FM receiver LO by tuning the frequency upward or downward, if the offset and the IF frequency may not be close enough or the same in step 408.

In step 412s, after FM receiver LO frequency adjustment, the FM receiver 180 may recheck for carrier error for successful channel signal CHx detection based on the same detection criteria in step 408s. If channel signal CHx is not detected (high carrier error), continue in step 413s.

In step 413s, FM channel being not detected (carrier error is large) and channel spacing information may be incorrect. Various embodiments of the invention may be used to check the channel for further tuning or new channel spacing may be assigned for another scan. The algorithm will be further described in FIG. 4C.

In step 414s, FM channel is detected (carrier error is small) and channel spacing information with channel signal CHx frequency being confirmed. Each detected channel may be marked as even channel or odd channel with corresponding frequencies as earlier described in FIG. 2B. The memory 152c may be updated with the latest channel information such as channel spacing number of even channels and number of odd channels or other tuning criteria. If the current channel spacing had been adjusted to achieve channel detection, the memory 152c may also be updated with the new channel spacing and channel frequency information for a future scan.

In step 416s, the FM receiver 180 may check for any new channel tuning output from the processor 152a. If there is a new channel tuning output from the processor 152a, the processor will repeat step 402s or with input from step 404s to tune for a new channel signal, if no new channel tuning output, continue in step 418s.

In step 418s, in instances where there may be no new channel tuning output from the processor 152a, the FM receiver may stay on the tuned channel signal and end tuning process.

In step 407s, in instances where the IF signal IF2 or channel signal CHx may be less than the RSSI threshold level, the FM receiver 180 may ignore the signal CHx and continue in step 416s to update the memory 152c and ready for tuning to another available channel signal CHx.

In step 408s, in instances where the IF2 and the offset frequencies may be substantially close or equal, the channel signal CHx may be detected continue in step 416s to update the memory 152c and ready for tuning to another available channel signal CHx.

Figure 4B:
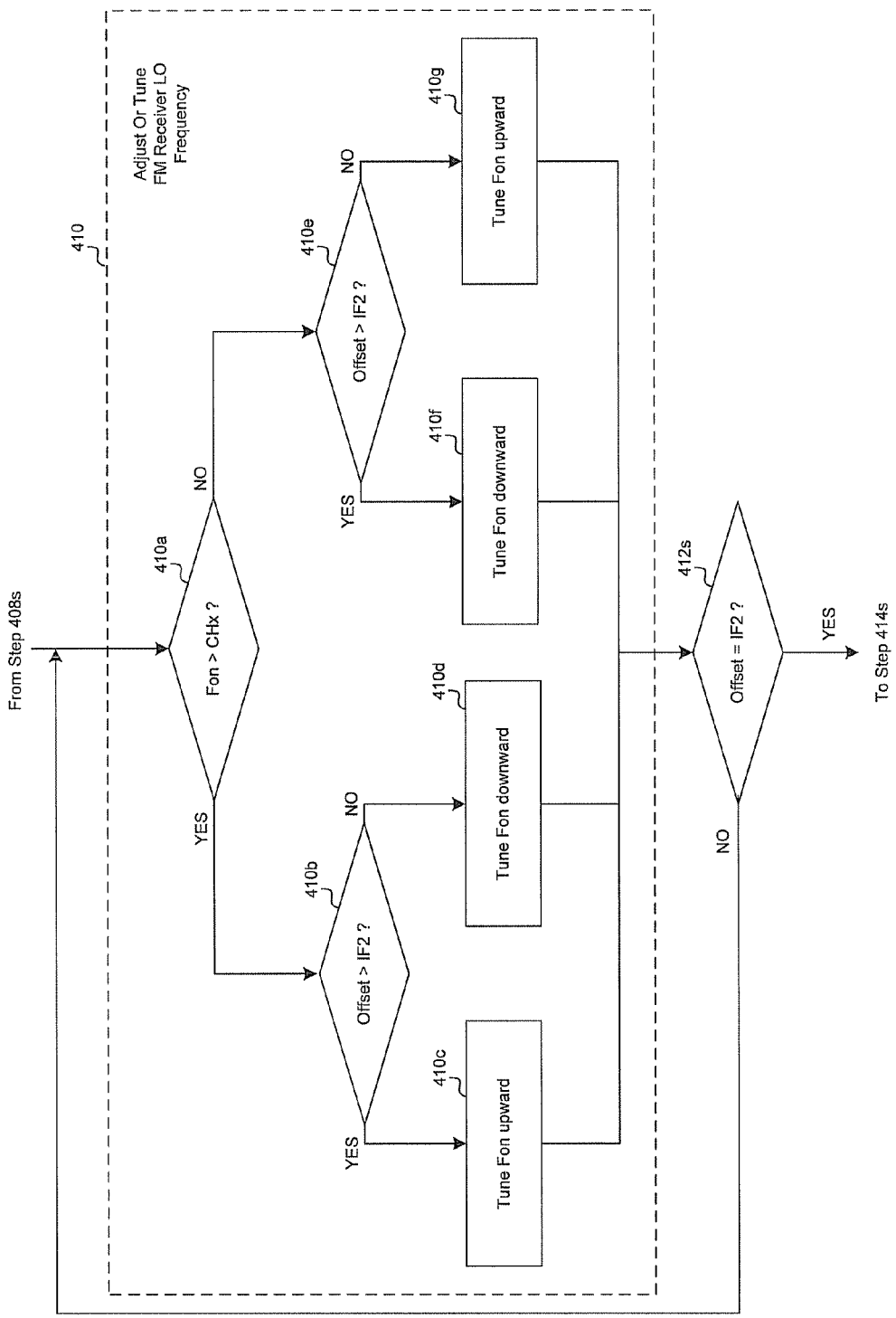
FIG. 4B is a flow chart that illustrates exemplary steps for dynamically adjusting or tuning of a FM receiver LO frequency, in accordance with an embodiment of the invention.

FIG. 4B is a flow chart that illustrates exemplary steps for dynamically adjusting or tuning a FM receiver LO frequency, in accordance with an embodiment of the invention. Step 410s may comprise exemplary steps 410a to 410g to illustrate how the FM receiver LO frequency may be adjusted to counter a tuning error such as a carrier error in channel signal CHx detection.

In step 410a, the FM receiver may comprise suitable logic, circuitry, and/or code that may enable determination of the LO frequency Fon is above or below the channel signal CHx. A frequency dependent output proportional to the frequency and phase difference between the LO frequency Fon and channel signal CHx may be determined. In an embodiment, a frequency discriminator (not shown) may be integrated into the FM receiver to perform the equivalent function. In instances where the LO frequency Fon may be greater than the channel signal CHx, the exemplary steps may continue to step 410b, otherwise the exemplary steps may continue to step 410e.

In step 410b, the FM receiver 180 may determine whether the offset frequency may be greater than the intermediate frequency IF2. In instances where the offset frequency may be greater, control may pass to step 410c. In instances where the offset may not be greater, control may pass to step 410d.

In step 410c, the LO frequency Fon is greater than the channel signal CHx and the offset frequency may be greater than the intermediate frequency IF2. The processor 152a may be enabled to generate an output signal 192 to tune the LO frequency Fon upward.

In step 410d, the LO frequency Fon may be greater than the channel signal CHx and the offset frequency may not be greater than the intermediate frequency IF2. The processor 152a may be enabled to generate an output signal 192 to tune the LO frequency Fon downward.

In step 410e, the FM receiver 180 may be enabled to check whether the offset frequency may be greater than the intermediate frequency IF2. In instances where the offset frequency may be greater, control may pass to step 410f. In instances where the offset frequency may not be greater, control may pass to step 410g.

In step 410f, the LO frequency Fon may not be greater than the channel signal CHx and the offset frequency may be greater than the intermediate frequency IF2. The processor 152a may be enabled to generate a signal 192 to tune the LO frequency Fon downward.

In step 410g, the LO frequency Fon may not be not greater than the channel signal CHx and the offset frequency may not be greater than the intermediate frequency IF2. The processor 152a may be enabled to generate a signal 192 to tune the LO frequency Fon upward.

After the tuning in steps 410c, 410d, 410f and 410g, the FM receiver 180 may be enabled to determine whether the channel signal CHx may be detected by checking whether the intermediate frequency offset or carrier error. In this instance, the frequency offset may be substantially the same or close to the signal IF2 in step 412s shown in FIG. 4A. Instances where the channel signal CHX may be detected, execution may continue to step 414s. In instances where the channel signal may not be detected, the frequency tuning steps starting step 410a may be repeated.

Figure 4C:
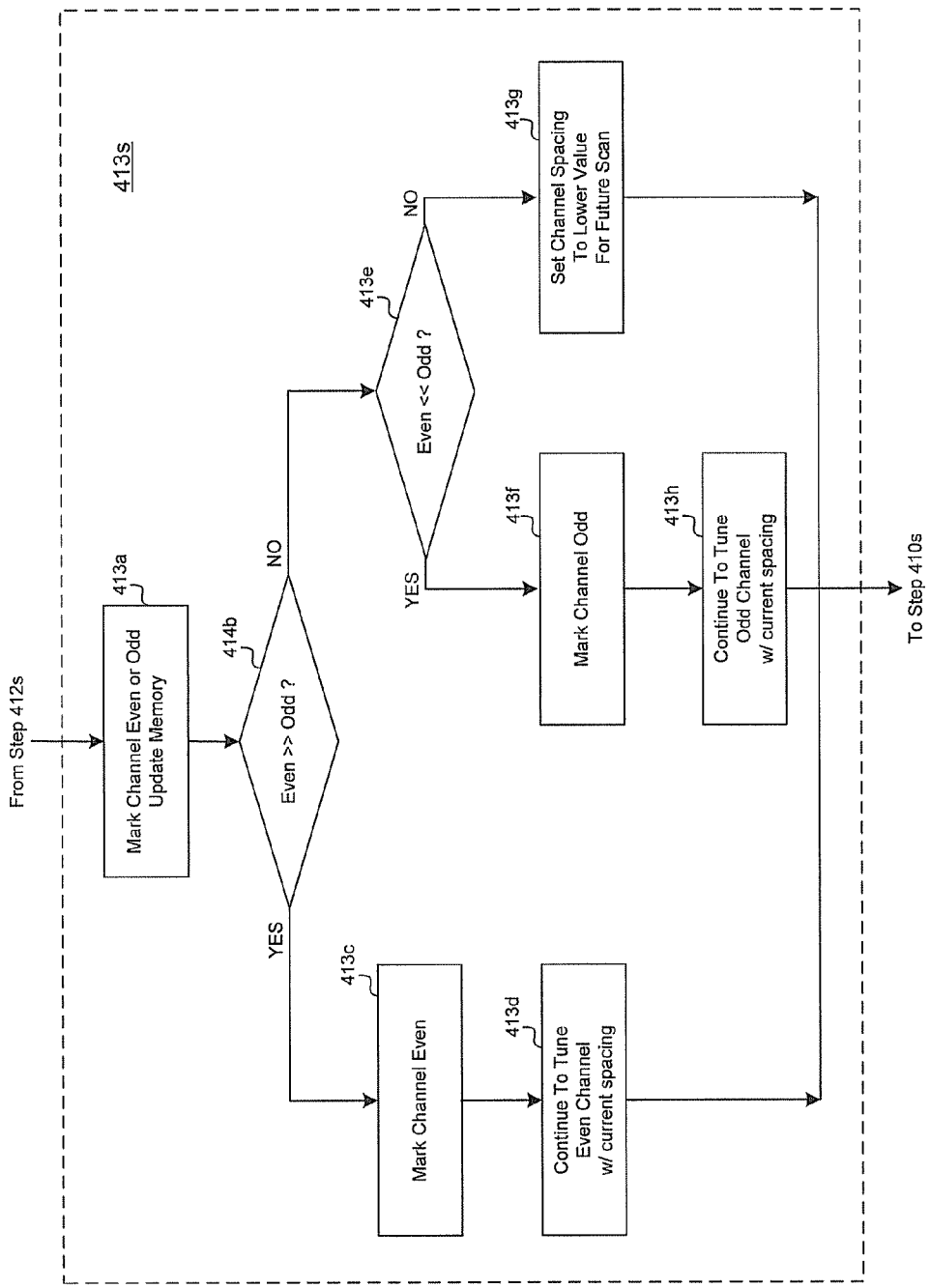
FIG. 4C is a flow chart that illustrates exemplary steps for channel spacing determination in a FM receiver, in accordance with an embodiment of the invention.

FIG. 4C is a flow chart that illustrates exemplary steps for channel spacing determination in a FM receiver, in accordance with an embodiment of the invention. Step 413s checks and adjust channel spacing by a self measurement routine to determine channel spacing such as S1 208a to S4 208d. Correct channel spacing such as S1 208a may be used for tuning to subsequent odd channels or even channels. In instance where the channel spacing may be incorrect, a different channel spacing higher or lower than the current channel spacing may be used for a next scan or LO adjustment in step 410s.

In step 413a, channels may be marked as even channels such as CH2 202b and CH4 202d or odd channels such as CH1 202a, CH3 202c and CH5 202e with memory 152c updated. In step 413b, the processor 152a checks the updated memory to determine whether the even channels or the odd channels being greater. In step 413c, if even channels being much greater, the channels may be marked even. In step 413d the current channel spacing may be used to tune the subsequent even channels in step 410s at the current channel frequency.

In step 413e, the processor 152c may check whether the odd channels are much greater. In step 413f, if the number of odd channels is much greater, the channels may be marked odd. In step 413h, the current channel spacing may be used to tune the subsequent odd channels and determine from step 410s the current channel frequency. In step 413g, if the number of even channels and odd channels are close or near even, the current channel spacing used may be invalid. A new channel spacing may be used with a frequency value lower than or higher than the current channel spacing for tuning or a new scan in step 410s.

The steps of the process in FIGS. 4A to 4C may be rearranged in a different order or substituted with similar or equivalent operation to accomplish the same tuning process without departing from the scope and spirit of the invention.

In accordance with various embodiments of the invention, processing channels in a FM communication system may comprise adjusting a tuning frequency Fon of a FM receiver 180 for scanning and detecting an FM channel CHx based at least one of the knowledge from a location of the FM receiver, a received signal strength indicator (RSSI) and a carrier error of a related FM signal CHx. The knowledge of the location of the FM receiver 180 may comprise the location identity, the country identity, and/or the FM station identity. The adjusting of the tuning frequency Fon of a FM receiver 180 may be done dynamically, for example, when the location of the FM receiver changes. Information for a detected FM channel CHx may be stored during scanning. The stored information may be retrieved and utilized for subsequent tuning to the detected FM channel CHx.

The tuning frequency utilized for scanning may be configured based on channel spacing S1 to S4 of local FM channels CH1 to CH5. The tuning frequency Fon utilized for scanning may also be configured based on local FM channel CHx availability. A frequency offset may be adjusted during scanning, where the frequency offset may be represented by the following relationship:

$$Abs(Fon-CHx)=IF2$$

when detection occurs, where the channel spacing and frequency offset may be derived from a self measurement method.

In another aspect of the invention, one or more FM channels CHx may be selectively bypassed during scanning. The bypassing of one or more FM channels CHx may be based on RSSI magnitude, carrier error, channel spacing, user input, and/or a preprogrammed selection.

FIG. 5A is an exemplary diagram illustrating detection of occupied or unoccupied local FM channels, in accordance with an embodiment of the invention. Referring to FIG. 5A, there is shown 12 exemplary local FM channels CH1 502a to CH12 502l in the local FM spectrum 500A after a full scan as described in FIG. 2A to 2C. There is shown seven detected occupied local FM channels CH1 502a to CH3 502c, CH5 502e, CH8 502h, CH9 502i and CH11 502k where each of the respective occupied local FM channels may have signal amplitude exceeding the RSSI detection threshold 506.

There is also shown channel CH6 502f with a weak signal amplitude below the RSSI detection threshold 506 (near noise level), which may be a valid occupied channel after further verification with the RDS/RDBS data from the local FM station. In an embodiment of the invention, channel CH6 502f may be considered as an unoccupied channel available for local FM transmission.

There may be other spurious signals with weak signal amplitude in the local FM spectrum such as signals 504a and 504b that may not be regarded as usable local FM channels for transmission for reasons of irregular channel spacing, being too close to an interfering channel CH6 502h, CH11 502k or other reasons.

Alternately, there is shown that channel CH1 502a may be identified as a valid local FM channel being transmitted through a detection of an FM channel transmission pause 590 despite of its marginal RSSI level. Channel CH11 502k may be identified as a valid local FM channel transmitted being a harmonic 592a of a detected stereo pilot signal 592.

FIG. 5B is an exemplary diagram illustrating extraction of unoccupied local FM channels available for transmission, in accordance with an embodiment of the invention. Referring to FIG. 5B, there is shown five exemplary unoccupied local FM channels available for local FM transmission CH4 502d, CH6 502f, CH7 502g, CH10 502j and CH12 502l extracted after a full scan of the local FM spectrum 500A shown in FIG. 5A.

The unoccupied local FM channels may be derived from detected occupied local FM channels. Vice versa, the occupied local FM channel may be inferred from the absence of a signal with significant amplitude such as above the RSSI detection level, in combination with at least one of the RDS/RDBS data information such as channel frequencies or channel spacing. Other exemplary inputs such as utilizing an optional GPS location information, channel frequency and channel spacing determination are disclosed in the U.S. application Ser. No. 11/755,395, which is hereby incorporated herein by reference, and may be used to generate a local FM channel list for suitable local FM channel transmission.

Figure 5C:
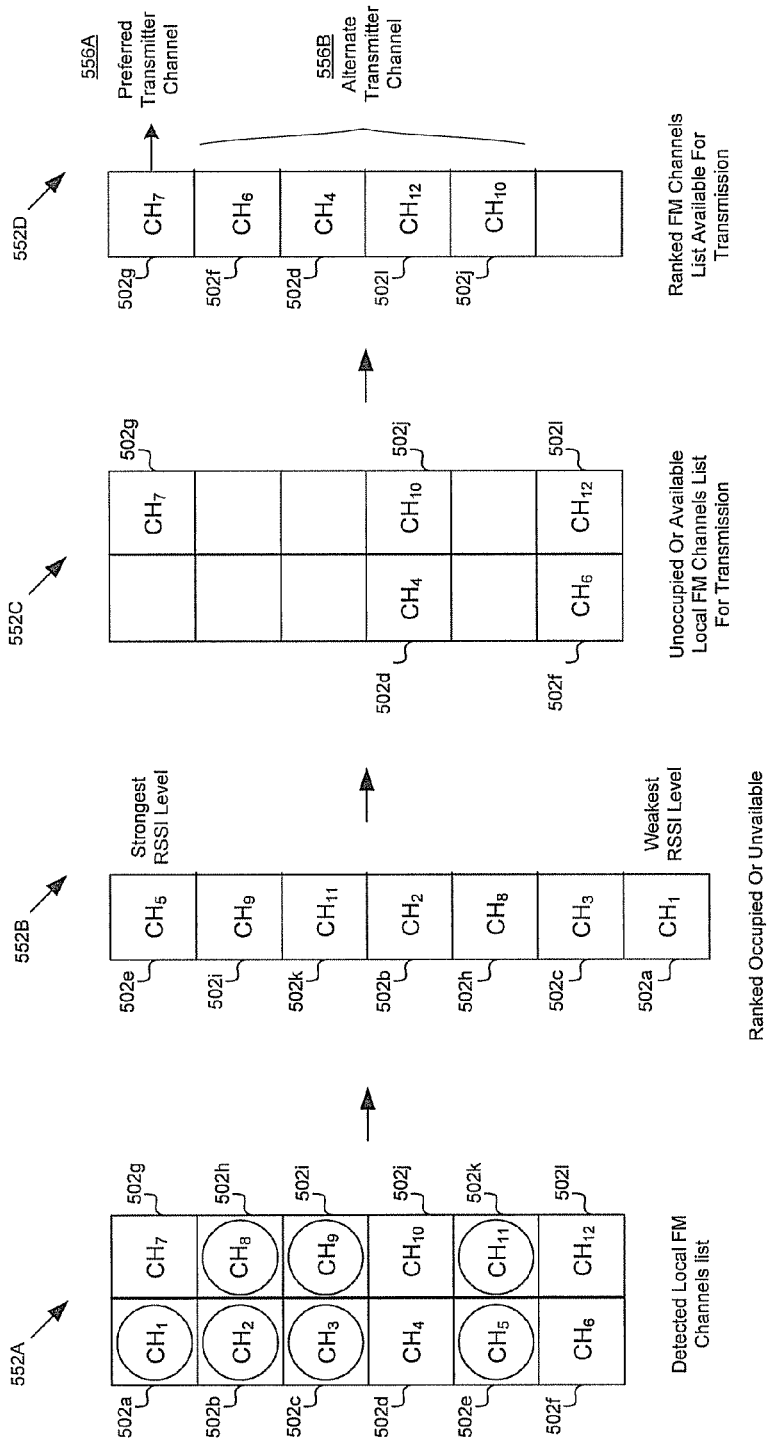
FIG. 5C illustrates an exemplary process of generating and ranking of FM channels list available for transmission, in accordance with an embodiment of the invention.

FIG. 5C illustrates an exemplary process of generating and ranking of FM channels list available for transmission, in accordance with an embodiment of the invention. Referring to FIG. 5C, there is shown one or more FM channel lists 552A to 552D may be derived from FIG. 5A or FIG. 5B. FM channel list 552A may comprise local FM channels CH1 502a to CH12 502l. In FIG. 5C, there is shown seven detected occupied local FM channels (circled channels) CH1 502a to CH3 502c, CH5 502e, CH8 502h, CH9 502i and CH11 502k, and five unoccupied local FM channels CH4 502d, CH6 502f, CH7 502g, CH10 502j and CH12 502l.

FM Channel list 552B may be derived from the FM channel list 552A. The FM Channel list 552B may comprise of seven occupied local FM channels CH1 502a to CH3 502c, CH5 502e, CH8 502h, CH9 502i and CH11 502k. In an embodiment of the invention, the seven occupied local FM channels CH5 502e, CH9 502i, CH11 502k, CH2 502b, CH8 502h, to CH3 502c and CH1 502a may be ranked according to the respective RSSI amplitude in the FM Channel list 552B. Channel CH5 502e being the strongest RSSI level and channel CH1 502a being the weakest RSSI level in the FM Channel list 552B.

FM Channel list 552C may be derived from the FM channel list 552A. The FM Channel list 552C may comprise five exemplary unoccupied local FM channels CH4 502d, CH6 502f, CH7 502g, CH10 502j and CH12 502l being available for local FM transmission as shown in FIG. 5B.

In an embodiment of the invention, the FM Channel list 552C may be ranked according to increasing neighboring channel interferences to generate a FM Channel list 552D. The FM Channel list 552D may illustrate an exemplary ranking order of CH7 502g, CH6 502f, CH4 502d, CH12 502l and CH10 502j. Channel CH7 502g may be ranked as the preferred transmitter channel 556A with the least neighboring channel interference. Channel CH10 502j may be ranked as the least preferred transmitter channel with highest neighboring channel interference in the alternate transmitter channels 556B.

Referring to FIG. 5A and FM channel list 552D in FIG. 5C, there is shown channel CH7 502g has two neighboring channels CH6 502f and CH8 502h. Neighboring channel CH6 502f may have a noise floor signal amplitude (below RSSI detection threshold) and neighboring channel CH8 may have moderate to low signal amplitude. Channel CH6 has neighboring channels CH5 502e and CH7 502g. Although neighboring channel CH7 502g may be at noise floor, neighboring channel CH5 502e may be shown as the strongest interfering channel in the FM frequency spectrum 500A. Hence, channel CH7 502g may be ranked or preferred above channel CH6 502f.

Channel CH4 502d has neighboring channels CH3 502c and channel CH5 502e. Channel CH4 502d may be inferior to channel CH6 502f for reason that neighboring channel CH3 502c is a valid occupied local FM channel above the noise floor, while channel CH6 502f being neighboring to channel CH7 502*g* at noise floor. Hence, channel CH6 502*f* may be ranked above channel CH4 502*d*.

Channel CH12 502*l* has only one strong interfering neighboring channels CH11 502*k*. In an embodiment of the invention, channel CH4 502*d* may be inferior to Channel CH12 502*l* for reason that channel CH4 502*d* has two neighboring channel while channel CH12 502*l* has one neighboring channel. In another embodiment of the invention, alternate channel CH6 502*f* may have closer proximity to channel CH4 502*d* (separated by two channel spacing) than to channel CH12 502*l* (separated by six channel spacing. Hence, channel CH4 502*d* may be ranked above channel CH12 502*l*.

Channel CH10 502*j* has two strong neighboring interfering channels CH9 502*i* and CH11 502*l*. Channel CH12 502*l* has only one strong interfering neighboring channels CH11 502*k*. Hence, channel CH12 502*l* may be ranked above channel CH10 502*j*.

The order of channel may vary depending on the ranking algorithm and other factors such as weighing factors, or spurious considerations may be included for ranking determination.

FIG. 5D is an exemplary diagram illustrating a dynamic detection of occupied or unoccupied local FM channels when location or time changes, in accordance with an embodiment of the invention. FIG. 5D illustrates dynamic changes make take place within local FM channel spectrum 500B due to a location change of the radio 150*a* or local FM broadcasting channels change at a different time instance. Referring to FIG. 5D, a scan may detect that the local FM channel CH11 502*k* may be switched to channel CH7 502*g*. A user using the preferred channel CH7 502*g* from the FM channel list may experience a strong interference at this channel since channel CH7 502*g* may no longer be available for local FM transmission by the radio 150*a* or the integrated FM Tx/Rx system 400.

FIG. 5E illustrates an exemplary dynamic process of updating a FM channels list available for transmission, in accordance with an embodiment of the invention. Referring to FIG. 5E, there is shown an updated occupied local FM channel list 552E may be generated. The updated occupied local FM channel list 552E may comprise seven occupied local FM channels CH5 502*e*, CH9 502*i*, CH7 502*g*, CH2 502*b*, CH8 502*h*, to CH3 502*c* and CH1 502*a* and they may be ranked according to the respective RSSI amplitude in the FM Channel list 552E.

The FM Channel list 552F may be derived from the FM channel list 552E. The FM Channel list 552C may comprise of five unoccupied local FM channels CH4 502*d*, CH6 502*f*, CH10 502*j*, CH11 502*k* and CH12 502*l* that may be available for local FM transmission as shown in FIG. 5B.

The FM Channel list 552G may be updated and dynamically ranked according to neighboring channel interference. FM Channel list 552G may illustrate an exemplary ranking order of CH12 502*l*, CH11 502*k*, CH10 502*j*, CH4 502*d* and CH6 502*f*. Channel CH12 502*l* may be ranked as the preferred transmitter channel 556C while channel CH6 502*f* may be ranked as the least preferred transmitter channel in the alternate transmitter channel list 556D. The ranking order in FM Channel list 552G may use similar neighboring interfering channel algorithm described in FIG. 5C.

The dynamic detection algorithm illustrated in FIGS. 5A to 5E may be enabled to determine which FM channels have the lowest noise floor, and accordingly select those channels as being suitable for transmission of FM data. The detection algorithm may be enabled to operate, for example, where there is a pause 490 in a transmitted FM stream 488. The detection algorithm may utilize simultaneous FM Tx and FM Rx or multiplexed FM Tx and FM Rx to determine those channels suitable for transmitting or broadcasting FM data shown in FIG. 4.

Figure 6A:
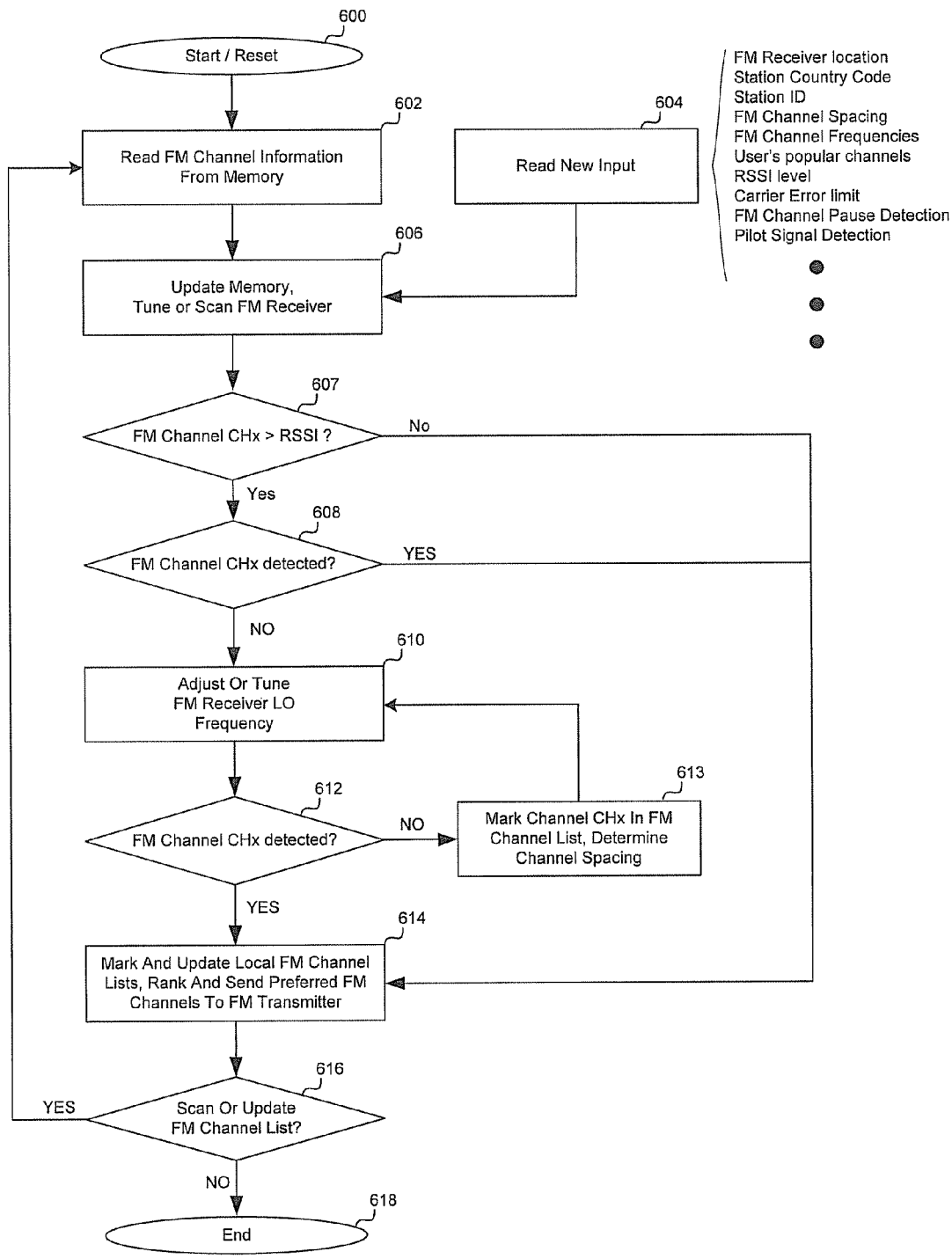
FIG. 6A is a flow chart that illustrates exemplary steps in dynamically generating and ranking a local FM channels list for transmission, in accordance with an embodiment of the invention.

FIG. 6A is a flow chart that illustrates exemplary steps in dynamically generating and ranking a local FM channels list for transmission, in accordance with an embodiment of the invention. Reference designations in FIG. 1C, FIG. 4 and FIGS. 5A to 5E may be referenced to throughout the flow charts description at various steps in FIGS. 6A and 6B.

Step 600 may represent an initial or a reset condition for a FM radio 150*a* or integrated FM Tx/Rx system 400 without prior knowledge of the location, channel frequencies and channel spacing information. In step 602 a processor 152*a* or 440 may read FM channel information such as available RDS/RDBS data 152*d* or 452*b* from a memory 152*c* or 428. A FM radio receiver 180 or FM Rx block 432 may start scanning with a default channel setting for a local FM station such as start tuning a LO 180*a* or DDFS 416 from the low end of the band. The available RDS/RDBS data 152*d* or 452*b* may be derived from a previous scan or previously stored information which may for example, be retrieved from a preprogrammed database.

Concurrently in step 604, respective new inputs 191, 193, 194 or 491, 496 comprising FM radio receiver location, station country code or country identity, station ID, FM channel spacing, FM channel frequencies, signal RSSI level, carrier error limit or any user inputs such as favorite channels may be communicated to the processor 152*a* or 440 and to update the memory 152*c* or 428.

In step 606, the processor 152*a* or 440 may generate an output 192 or frequency control word 434 to tune the FM radio receiver local oscillator LO 180*a* or DDFS 416 based on respective inputs from 191, 193, 194 or 491, 496 and data from the updated memory 152*c* or 428. The tuning output 192 or frequency control word 434 may facilitate scanning by tuning the LO 180*a* or DDFS 416 in both direction (upward or downward) across a portion of or the entire tuning range. The tuning or scanning may comprise continuous tuning or selective tuning by frequency hops.

In step 607, the RSSI function may check if the channel signal CHx exceeds a RSSI detection threshold level 206 or 306. If one or more channel signals CHx may be less than the RSSI threshold level 206 or 306, the FM radio receiver 180 or FM Rx block 432 may ignore the channel signals CHx such as CH4 502*d*, CH6 502*f*, CH7 502*g*, CH10 502*j* and CH12 502*l* and go to step 614 to update a FM channel list 552C. The channel signals CH4 502*d*, CH6 502*f*, CH7 502*g*, CH10 502*j* and CH12 502*l* may be marked and updated as unoccupied FM channels available for transmission.

In step 608, if the channel signal CHx exceeds the RSSI threshold level, the FM radio receiver 180 or FM Rx block 432 may determine whether any channel signal CHx may be successfully detected or identified. There may be different ways to identify or detect the channel signal CHx. In one embodiment of the invention, a successful channel signal CHx identification or detection may be indicated by a small carrier error, such as the difference of the offset and the IF frequency (IF2) being substantially small as earlier described in FIG. 1C. Other identification methods may comprise the detection of a pause 490 during signal transmission 488, detection of a stereo pilot signal 592 or based on the RDS/RDBS information in the channel signal CHx.

In step 608, if the IF signal IF2 and the offset frequencies may be substantially close or equal, the channel signal CHx such as CH1 502*a* to CH3 502*c*, CH5 502*e*, CH8 502*h*, CH9 502*i* and CH11 502*k* may be detected or identified and go to step 614 to update the FM channel list 552B. The channel signals CH1 502*a* to CH3 502*c*, CH5 502*e*, CH8 502*h*, CH9 502*i* and CH11 502*k* may be marked and updated as occupied FM channel unavailable for transmission.

In step 610, if the channel signal CHx may be not be detected or identified in step 608, the processor 152*a* or 440 may adjust or tune the FM radio receiver LO 180*a* or DDFS 416 frequency upward or downward to search for a successful detection of a tuned channel signal CHx.

In step 612, after the FM radio receiver LO frequency tuning adjustment, the FM radio receiver 180 or FM Rx block 432 may recheck for successful channel signal CHx detection. If the channel signal CHx may be detected or identified, go to step 614. If the channel signal CHx may not be detected or identified, go to step 613.

In step 613, if the channel signal CHx may not be detected or identified, the channel spacing may be wrong. The processor 152*a* or 440 may mark and update the channel signal CHx in a FM channel list 552A as an even or odd channel. A channel spacing determination algorithm may be executed by returning to step 610 for LO frequency adjustment.

In step 614, the processor 152*a* or 440 may mark and update one or more local FM channels lists such as channel lists 552A to 552D for exemplary illustration. Channel list 552A may comprise local FM channels CH1 502*a* to CH12 502*l* in the local FM channel spectrum after a full scan. Channel list 552B may comprise ranked occupied local FM channels CH5 502*e*, CH9 502*i*, CH11 502*k*, CH2 502*b*, CH8 502*h*, to CH3 502*c* and CH1 502*a* according to the respective RSSI amplitude. Channel list 552D may comprise ranked unoccupied FM channels CH7 502*g*, CH6 502*f*, CH4 502*d*, CH12 502*l* and CH10 502*j* available for transmission. FM channel CH7 502*g* may be the preferred channel with the least neighboring channel interference sent to the FM Tx block 440 for local FM transmission.

In step 616, the processor 152*a* or 440 may check if a new scan may be needed to dynamically update the local FM channel lists 552A to 552D. The processor 152*a* or 440 may return to step 602 to re-scan the local FM channels CH1 502*a* to CH12 502*l* to dynamically update the local FM channels lists 552A to 552D. Otherwise the scanning or update process may terminate at step 618 or local FM channel transmission may persist at the preferred FM channel from the local FM channel list 552D.

Figure 6B:
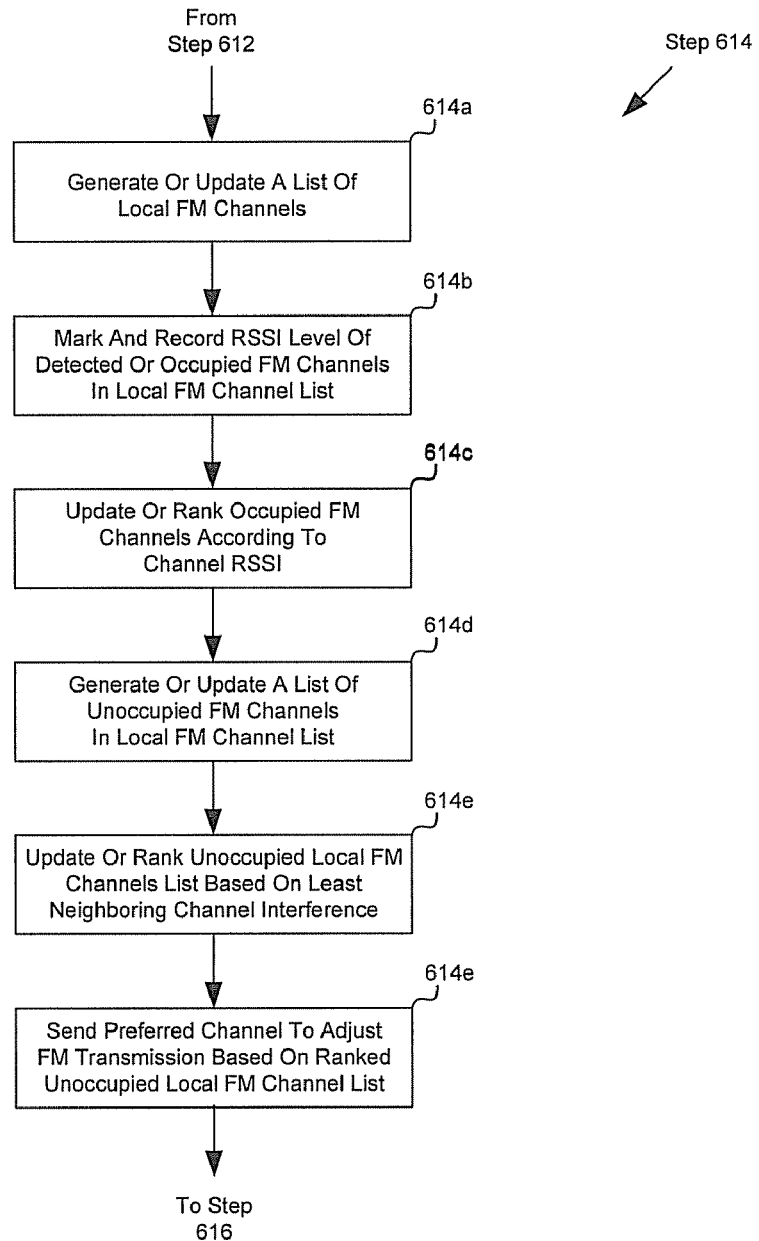
FIG. 6B is a flow chart that illustrates exemplary steps for the ranking of FM channels available for transmission in a FM channel list, in accordance with an embodiment of the invention.

FIG. 6B is a flow chart that illustrates exemplary steps for the ranking of FM channels available for transmission in a FM channel list, in accordance with an embodiment of the invention. FIG. 6B may describe step 614 in more details. In step 614*a*, one or more local FM channel lists 552A to 552D may be generated or updated during the scan process starting from steps 602 to 612.

In step 614*b*, the occupied or unavailable FM channels CH1 502*a* to CH3 502*c*, CH5 502*e*, CH8 502*h*, CH9 502*i* and CH11 502*k* may be marked or recorded with respective RSSI level in the local FM channel list 552A. In step 614*c*, the occupied local FM channels CH5 502*e*, CH9 502*i*, CH11 502*k*, CH2 502*b*, CH8 502*h*, to CH3 502*c* and CH1 502*a* may be ranked or updated according to the respective RSSI amplitude in the FM Channel list 552B. In step 614*d*, an unoccupied FM Channel list 552C comprising not being transmitted local FM channels CH4 502*d*, CH6 502*f*, CH7 502*g*, CH10 502*j* and CH12 502*l* may be generated and updated from the FM channel list 552A. In step 614*e*, unoccupied local FM channels CH7 502*g*, CH6 502*f*, CH4 502*d*, CH12 502*l* and CH10 502*j* may be updated or ranked in the FM Channel list 552D based on least neighboring channel interference analysis. In step 614*f*, channel CH7 502*g* may be sent as a preferred transmitter channel 556A for local FM transmission based on least neighboring interference from the ranked unoccupied local FM channel list 552D. Channels CH6 502*f*, CH4 502*d*, CH12 502*l* and CH10 502*j* may be the alternate transmitter channels 556B in the order of increasing neighboring channel interferences.

The steps of the processes in FIGS. 6A to 6B may be rearranged in a different order or substituted with similar or equivalent operation to accomplish the same result without departing from the scope and the spirit of the invention.

In accordance with various embodiments of the invention, the method for processing channel information in communication system may comprise, in a mobile FM radio system 100 or 400 comprising an integrated FM radio transmitter and FM radio receiver 444, dynamically generating a list 552A, 552B, 552C or 552D of local FM channels CH1 502*a* to CH12 502*l*. The local FM channels CH7 502*g*, CH6 502*f*, CH4 502*d*, CH12 502*l* and CH10 502*j* in the generated list 552D may be ranked. One of the ranked local FM channels CH7 502*g* from the list 552D for use by the FM radio transmitter 440. The list of local FM channels 552D may comprise unoccupied local FM channels CH4 502*d*, CH6 502*f*, CH7 502*g*, CH10 502*j* and CH12 502*l* not being transmitted. The list 552B of local FM channels may comprise local FM channels CH1 502*a* to CH3 502*c*, CH5 502*e*, CH8 502*h*, CH9 502*i* and CH11 502*k* currently being used for transmission.

The method of detecting channels currently being used for transmission may comprise detecting via the FM radio receiver 180 or 432, the local FM channels CH1 502*a* to CH3 502*c*, CH5 502*e*, CH8 502*h*, CH9 502*i* and CH11 502*k* currently being used for transmission. The FM radio receiver 180 or 432 may adjust a tuning frequency Fon or 426*a* and 426*b* for scanning and detecting the local FM channels CH1 502*a* to CH12 502*l* based on knowledge of a location of the FM radio receiver 180 or 432, received signal strength indicator (RSSI), and/or carrier error of a related FM signal CHx. The tuning frequency Fon or 426*a* and 426*b* may be dynamically adjusted when the location of the mobile FM radio system 100 or 400 changes.

The method for processing channel information in communication system 100 or 400 may comprise ranking the local FM channels CH7 502*g*, CH6 502*f*, CH4 502*d*, CH12 502*l* and CH10 502*j* based on neighboring FM channel interference, detecting a pause 590 in one of the local FM channels CH1 502*a* currently being used for transmission, and scanning for the local FM channels CH1 502*a* to CH12 502*l* during the detected pause 590. The local FM channels CH1 502*a* to CH12 502*l* may be scanned based on received RDS/RDBS data 152*d* or 452*b* Dynamic scan of the local FM channels CH1 502*a* to CH12 502*l* may be based on country code information in the received RDS/RDBS data 152*d* or 452*b*. The list of local FM channels CH1 502*a* to CH12 502*l* may be dynamically scanned based on a detected stereo pilot signal.

Another embodiment of the invention may provide a machine-readable storage, having stored thereon, a computer program having at least one code section executable by a machine, thereby causing the machine to perform the steps as described herein for detecting channels suitable for FM transmission in an integrated FM transmit receive (FM Tx/Rx) system.

Accordingly, the present invention may be realized in hardware, software, or a combination of hardware and software. The present invention may be realized in a centralized fashion in at least one computer system or in a distributed fashion where different elements are spread across several interconnected computer systems. Any kind of computer system or other apparatus adapted for carrying out the methods described herein is suited. A typical combination of hardware and software may be a general-purpose computer system with a computer program that, when being loaded and executed, controls the computer system such that it carries out the methods described herein.

The present invention may also be embedded in a computer program product, which comprises all the features enabling the implementation of the methods described herein, and which when loaded in a computer system is able to carry out these methods. Computer program in the present context means any expression, in any language, code or notation, of a set of instructions intended to cause a system having an information processing capability to perform a particular function either directly or after either or both of the following: a) conversion to another language, code or notation; b) reproduction in a different material form.

While the present invention has been described with reference to certain embodiments, it will be understood by those skilled in the art that various changes may be made and equivalents may be substituted without departing from the scope of the present invention. In addition, many modifications may be made to adapt a particular situation or material to the teachings of the present invention without departing from its scope. Therefore, it is intended that the present invention not be limited to the particular embodiment disclosed, but that the present invention will include all embodiments falling within the scope of the appended claims.

What is claimed is:

1. A method for processing channel information in communication system, the method comprising:
   in a mobile FM radio system comprising an integrated FM radio transmitter and FM radio receiver:
      dynamically generating a list of local FM channels by tuning said FM radio receiver utilizing channel spacing according to even channels, if a number of said even channels is greater than a number of odd channels, or utilizing channel spacing according to said odd channels, if a number of said odd channels is greater than a number of said even channels;
      ranking local FM channels in said generated list; and
      selecting one of said ranked local FM channels from said list for use by said FM radio transmitter, wherein said mobile FM radio system further communicates using cellular signals.

2. The method according to claim 1, wherein said list of local FM channels comprises unoccupied local FM channels not being transmitted.

3. The method according to claim 1, wherein said list of local FM channels comprises local FM channels currently being used for transmission.

4. The method according to claim 3, comprising detecting via said FM radio receiver, said local FM channels currently being used for transmission.

5. The method according to claim 1, comprising adjusting a tuning frequency of said FM radio receiver for scanning and detecting said local FM channels based on knowledge of a location of said FM radio receiver, received signal strength indicator (RSSI), and carrier error of a related FM signal, wherein said carrier error is based on a frequency difference between a tuning offset and a determined intermediate frequency (IF) signal.

6. The method according to claim 5, comprising dynamically adjusting said tuning frequency when said location of said mobile FM radio system changes.

7. The method according to claim 1, comprising ranking said local FM channels based on neighboring FM channel interference.

8. The method according to claim 1, comprising:
   detecting a pause in one of said local FM channels currently being used for transmission;
   and scanning for said local FM channels during said detected pause.

9. The method according to claim 1, comprising scanning for said local FM channels based on received RDS/RDBS data.

10. The method according to claim 1, comprising dynamically scanning for said local FM channels based on country code information in said received RDS/RDBS data.

11. The method according to claim 1, comprising dynamically generating said list of local FM channels based on a detected stereo pilot signal.

12. The method according to claim 1, wherein said generating utilizes channel spacing information based on determination of one of subsequent even and odd channels, or both of subsequent even and odd channels.

13. A non-transitory machine-readable storage having stored thereon, a computer program having at least one code section for processing channel information in communication system, the at least one code section being executable by a machine for causing the machine to perform steps comprising:
   in a mobile FM radio system comprising an integrated FM radio transmitter and FM radio receiver:
      dynamically generating a list of local FM channels by tuning said FM radio receiver utilizing channel spacing according to even channels, if a number of said even channels is greater than a number of odd channels, or utilizing channel spacing according to said odd channels, if a number of said odd channels is greater than a number of said even channels;
      ranking local FM channels in said generated list; and
      selecting one of said ranked local FM channels from said list for use by said FM radio transmitter, wherein said mobile FM radio system further communicates using cellular signals.

14. The non-transitory machine-readable storage according to claim 13, wherein said list of local FM channels comprises unoccupied local FM channels not being transmitted.

15. The non-transitory machine-readable storage according to claim 13, wherein said list of local FM channels comprises local FM channels currently being used for transmission.

16. The non-transitory machine-readable storage according to claim 15, wherein said at least one code section comprises code for detecting via said FM radio receiver, said local FM channels currently being used for transmission.

17. The non-transitory machine-readable storage according to claim 13, wherein said at least one code section comprises code for adjusting a tuning frequency of said FM radio receiver for scanning and detecting said local FM channels based on knowledge of a location of said FM radio receiver, received signal strength indicator (RSSI), and carrier error of a related FM signal, wherein said carrier error is based on a frequency difference between a tuning offset and a determined intermediate frequency (IF) signal.

18. The non-transitory machine-readable storage according to claim 17, wherein said at least one code section comprises code for dynamically adjusting said tuning frequency when said location of said mobile FM radio system changes.

19. The non-transitory machine-readable storage according to claim 13, wherein said at least one code section comprises code for ranking said local FM channels based on neighboring FM channel interference.

20. The non-transitory machine-readable storage according to claim 13, wherein said at least one code section comprises code for:
  detecting a pause in one of said local FM channels currently being used for transmission, and scanning for said local FM channels during said detected pause.

21. The non-transitory machine-readable storage according to claim 13, wherein said at least one code section comprises code for scanning for said local FM channels based on received RDS/RDBS data.

22. The non-transitory machine-readable storage according to claim 13, wherein said at least one code section comprises code for dynamically scanning for said local FM channels based on country code information in said received RDS/RDBS data.

23. The non-transitory machine-readable storage according to claim 13, wherein said at least one code section comprises code for dynamically generating said list of local FM channels based on a detected stereo pilot signal.

24. The non-transitory machine-readable storage according to claim 13, wherein said generating utilizes channel spacing information based on determination of one of subsequent even and odd channels, or both of subsequent even and odd channels.

25. A system for processing channel information in communication system, the system comprising:
  in a mobile FM radio system comprising an integrated FM transmitter and FM radio receiver, and at least one processor:
    said at least one processor dynamically generates a list of local FM channels by tuning said FM radio receiver utilizing channel spacing according to even channels, if a number of said even channels is greater than a number of odd channels, or utilizing channel spacing according to said odd channels, if a number of said odd channels is greater than a number of said even channels; and
    said at least one processor ranks local FM channels in said generated list, and selects one of said ranked local FM channels from said list for use by said FM radio transmitter, wherein said mobile FM radio system further communicates using cellular signals.

26. The system according to claim 25, wherein said list of local FM channels comprises unoccupied local FM channels not being transmitted.

27. The system according to claim 25, wherein said list of local FM channels comprises local FM channels currently being used for transmission.

28. The system according to claim 27, wherein said at least one processor detects via said FM radio receiver, said local FM channels currently being used for transmission.

29. The system according to claim 25, wherein said at least one processor adjusts a tuning frequency of said FM radio receiver for scanning and detecting said local FM channels based on knowledge of a location of said FM radio receiver, received signal strength indicator (RSSI), and carrier error of a related FM signal, wherein said carrier error is based on a frequency difference between a tuning offset and a determined intermediate frequency (IF) signal.

30. The system according to claim 25, wherein said at least one processor dynamically adjusts said tuning frequency when said location of said mobile FM radio system changes.

31. The system according to claim 25, wherein said at least one processor ranks said local FM channels based on neighboring FM channel interference.

32. The system according to claim 25, wherein said at least one processor detects a pause in one of said local FM channels currently being used for transmission, and scans for said local FM channels during said detected pause.

33. The system according to claim 25, wherein said at least one processor scans for said local FM channels based on received RDS/RDBS data.

34. The system according to claim 25, wherein said at least one processor dynamically scans for said local FM channels based on country code information in said received RDS/RDBS data.

35. The system according to claim 25, wherein said at least one processor dynamically generates said list of local FM channels based on a detected stereo pilot signal.

36. The system according to claim 25, wherein said generated list of local FM channels utilizes channel spacing information based on determination of one of subsequent even and odd channels, or both of subsequent even and odd channels.

* * * * *